US010685808B2

(12) United States Patent
Lozano et al.

(10) Patent No.: US 10,685,808 B2
(45) Date of Patent: *Jun. 16, 2020

(54) METHOD AND APPARATUS FOR A POROUS ELECTROSPRAY EMITTER

(71) Applicant: Massachusetts Institute of Technology, Cambridge, MA (US)

(72) Inventors: Paulo C. Lozano, Arlington, MA (US); Steven Mark Arestie, Redondo Beach, CA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/511,067

(22) Filed: Jul. 15, 2019

(65) Prior Publication Data
US 2019/0355543 A1 Nov. 21, 2019

Related U.S. Application Data

(63) Continuation of application No. 16/257,786, filed on Jan. 25, 2019, now Pat. No. 10,410,821, which is a
(Continued)

(51) Int. Cl.
H01J 37/08 (2006.01)
C25F 3/14 (2006.01)
(Continued)

(52) U.S. Cl.
CPC ........ H01J 37/08 (2013.01); B01L 3/502715 (2013.01); C25F 3/14 (2013.01);
(Continued)

(58) Field of Classification Search
CPC .... H01J 49/165; H01J 1/05; H01J 9/02; H01J 2237/08; H01J 2237/0822; H01J 49/167;
(Continued)

(56) References Cited

U.S. PATENT DOCUMENTS 3,486,302 A 12/1969 Paynter
4,855,604 A 8/1989 Riahi
(Continued)

FOREIGN PATENT DOCUMENTS

WO WO 2002/055990 A2 7/2002
WO WO 2006/009854 A2 1/2006
(Continued)

OTHER PUBLICATIONS

International Search Report and Written Opinion dated Oct. 9, 2014 for PCT/US2014/039851.
(Continued)

Primary Examiner — David A Vanore
(74) Attorney, Agent, or Firm — Wolf, Greenfield & Sacks, P.C.

(57) ABSTRACT

An ionic liquid ion source can include a microfabricated body including a base and a tip. The body can be formed of a porous material compatible with at least one of an ionic liquid or room-temperature molten salt. The body can have a pore size gradient that decreases from the base of the body to the tip of the body, such that the at least one of an ionic liquid or room-temperature molten salt is capable of being transported through capillarity from the base to the tip.

20 Claims, 23 Drawing Sheets

Related U.S. Application Data continuation of application No. 15/805,050, filed on Nov. 6, 2017, now Pat. No. 10,236,154, which is a continuation of application No. 15/272,574, filed on Sep. 22, 2016, now Pat. No. 9,905,392, which is a continuation of application No. 14/336,814, filed on Jul. 21, 2014, now Pat. No. 9,478,403, which is a continuation of application No. 14/070,351, filed on Nov. 1, 2013, now Pat. No. 8,785,881, which is a continuation-in-part of application No. 13/839,064, filed on Mar. 15, 2013, now Pat. No. 8,791,411, which is a continuation-in-part of application No. 13/681,155, filed on Nov. 19, 2012, now abandoned, which is a continuation of application No. 12/990,923, filed as application No. PCT/US2009/042990 on May 6, 2009, now Pat. No. 8,324,593.

(60) Provisional application No. 61/050,847, filed on May 6, 2008, provisional application No. 61/695,034, filed on Aug. 30, 2012.

(51) Int. Cl.
*H01J 1/05* (2006.01)
*H01J 9/02* (2006.01)
*B01L 3/00* (2006.01)
*H01J 49/04* (2006.01)

(52) U.S. Cl.
CPC .............. *H01J 1/05* (2013.01); *H01J 9/02* (2013.01); *H01J 49/0445* (2013.01); *H01J 2237/0802* (2013.01); *H01J 2237/317* (2013.01)

(58) Field of Classification Search
CPC ..... H01J 2201/30434; H01J 2237/0805; H01J 49/0404; H01J 49/0431; B82Y 30/00; B64G 1/405
USPC ................ 250/281, 282, 288, 423 R, 424
See application file for complete search history.

(56) References Cited

U.S. PATENT DOCUMENTS

| | | | |
|---|---|---|---|
| 5,018,634 A | 5/1991 | Le Touche | |
| 5,279,323 A | 1/1994 | Grove et al. | |
| 5,399,865 A | 3/1995 | Umemura et al. | |
| 5,624,875 A | 4/1997 | Nakanishi et al. | |
| 6,068,882 A | 5/2000 | Ryu | |
| 6,288,390 B1* | 9/2001 | Siuzdak | H01J 49/0418 250/288 |
| 6,297,499 B1* | 10/2001 | Fenn | H01J 49/167 250/288 |
| 6,707,035 B2* | 3/2004 | Hughey | G01N 30/7233 250/281 |
| 6,768,119 B2 | 7/2004 | de la Mora et al. | |
| 6,867,415 B2 | 3/2005 | Hughey et al. | |
| 6,952,013 B2* | 10/2005 | Granger | H01J 49/0436 204/435 |
| 7,015,046 B2* | 3/2006 | Wohlstadter | B01L 3/5027 204/291 |
| 7,097,781 B2 | 8/2006 | Asakawa et al. | |
| 7,129,513 B2* | 10/2006 | Zhou | B82Y 10/00 257/10 |
| 7,199,364 B2 | 4/2007 | Thakur | |
| 7,335,897 B2* | 2/2008 | Takats | H01J 49/0404 250/282 |
| 7,397,032 B2 | 7/2008 | Zona et al. | |
| 7,517,479 B2 | 4/2009 | Bango et al. | |
| 7,696,489 B2* | 4/2010 | Pilz | H01J 27/26 250/423 F |
| 7,759,643 B2 | 7/2010 | Lloyd et al. | |
| 7,863,581 B2 | 1/2011 | Lozano et al. | |
| 7,932,492 B2* | 4/2011 | Demmons | H01J 49/165 250/288 |
| 8,003,937 B2 | 8/2011 | Kertesz et al. | |
| 8,030,621 B2 | 10/2011 | Lozano et al. | |
| 8,080,930 B2 | 12/2011 | King | |
| 8,084,735 B2* | 12/2011 | Kertesz | H01J 49/165 250/281 |
| 8,198,106 B2 | 6/2012 | Akinwande et al. | |
| 8,207,496 B2 | 6/2012 | Makarov et al. | |
| 8,227,765 B2 | 7/2012 | Syms | |
| 8,272,345 B2 | 9/2012 | Robertson et al. | |
| 8,324,593 B2 | 12/2012 | Lozano et al. | |
| 8,368,295 B2 | 2/2013 | Wei et al. | |
| 8,394,877 B2 | 3/2013 | Asakawa et al. | |
| 8,722,323 B2 | 5/2014 | Wohlstadter et al. | |
| 8,754,370 B1 | 6/2014 | Wang et al. | |
| 8,785,881 B2* | 7/2014 | Lozano | H01J 37/08 250/423 R |
| 8,791,411 B2 | 7/2014 | Lozano et al. | |
| 8,850,792 B2 | 10/2014 | Marrese-Reading et al. | |
| 9,110,071 B2 | 8/2015 | Marto | |
| 9,194,379 B1 | 11/2015 | Biblarz et al. | |
| 9,302,225 B2* | 4/2016 | Whitehouse | G01N 30/7266 |
| 9,358,556 B2 | 6/2016 | Velásquez-Garcia et al. | |
| 9,362,097 B2 | 6/2016 | Lozano et al. | |
| 9,460,884 B2 | 10/2016 | Hopwood | |
| 9,478,403 B2* | 10/2016 | Lozano | H01J 37/08 |
| 9,638,178 B1* | 5/2017 | Courtney | F03H 1/0012 |
| 9,669,416 B2 | 6/2017 | Velasquez-Garcia et al. | |
| 9,895,706 B2 | 2/2018 | Velasquez-Garcia et al. | |
| 9,905,392 B2 | 2/2018 | Lozano et al. | |
| 10,125,052 B2* | 11/2018 | Lozano | C01B 32/05 |
| 10,236,154 B2 | 3/2019 | Lozano et al. | |
| 10,308,377 B2 | 6/2019 | Lozano et al. | |
| 2004/0194305 A1 | 10/2004 | deRochemont et al. | |
| 2004/0245457 A1 | 12/2004 | Granger et al. | |
| 2005/0131163 A1 | 6/2005 | Rhine et al. | |
| 2005/0133372 A1 | 6/2005 | Zhou et al. | |
| 2005/0233085 A1 | 10/2005 | Miller et al. | |
| 2005/0269559 A1 | 12/2005 | Zhou et al. | |
| 2005/0281379 A1 | 12/2005 | Qiu et al. | |
| 2005/0287421 A1 | 12/2005 | Simon et al. | |
| 2007/0170056 A1* | 7/2007 | Arnold | G01N 27/403 204/412 |
| 2007/0235647 A1 | 10/2007 | Zona et al. | |
| 2008/0011617 A1 | 1/2008 | Struthers et al. | |
| 2008/0051881 A1 | 2/2008 | Feng et al. | |
| 2008/0087811 A1 | 4/2008 | Knapp | |
| 2008/0131615 A1 | 6/2008 | Robertson et al. | |
| 2008/0307766 A1 | 12/2008 | Petras et al. | |
| 2009/0032724 A1 | 2/2009 | Lozano et al. | |
| 2009/0072750 A1 | 3/2009 | Akinwande et al. | |
| 2009/0113872 A1 | 5/2009 | Demmons et al. | |
| 2009/0114838 A1* | 5/2009 | Lozano | H01J 3/04 250/396 R |
| 2009/0130380 A1 | 5/2009 | Asakawa et al. | |
| 2009/0153015 A1 | 6/2009 | King | |
| 2009/0224679 A1 | 9/2009 | Pan et al. | |
| 2009/0283824 A1 | 11/2009 | Knight et al. | |
| 2009/0309481 A1 | 12/2009 | Chou et al. | |
| 2010/0072394 A1 | 3/2010 | Kertesz et al. | |
| 2010/0139823 A1 | 6/2010 | Gash et al. | |
| 2010/0201251 A1 | 8/2010 | Park et al. | |
| 2010/0209788 A1 | 8/2010 | Yoon et al. | |
| 2010/0284735 A1 | 11/2010 | Sievers et al. | |
| 2010/0289413 A1 | 11/2010 | Eden et al. | |
| 2011/0037102 A1 | 2/2011 | Tchertchian et al. | |
| 2011/0079138 A1 | 4/2011 | Storrie et al. | |
| 2011/0079188 A1 | 4/2011 | Meintschel et al. | |
| 2011/0101122 A1* | 5/2011 | Oleschuk | B05B 5/0255 239/3 |
| 2011/0124116 A1 | 5/2011 | Wohlstadter et al. | |
| 2011/0126929 A1 | 6/2011 | Velasquez-Garcia et al. | |
| 2011/0150765 A1* | 6/2011 | Boyden | A61K 9/0019 424/9.1 |
| 2011/0210265 A1* | 9/2011 | Lozano | F03H 1/0012 250/423 R |
| 2011/0217544 A1 | 9/2011 | Young et al. | |

(56) References Cited

U.S. PATENT DOCUMENTS

| | | | |
|---|---|---|---|
| 2011/0284735 A1* | 11/2011 | Van Berkel | G01N 1/4055 250/282 |
| 2012/0024421 A1 | 2/2012 | Boutet et al. | |
| 2012/0037595 A1 | 2/2012 | Asakawa et al. | |
| 2012/0045863 A1 | 2/2012 | Hopwood | |
| 2012/0104554 A1 | 5/2012 | Eden et al. | |
| 2012/0119079 A1* | 5/2012 | Ouyang | H01J 49/0431 250/282 |
| 2012/0144796 A1* | 6/2012 | Marrese-Reading | B64G 1/405 60/202 |
| 2012/0189836 A1 | 7/2012 | Kruglick | |
| 2012/0244291 A1* | 9/2012 | Bisht | D04H 1/728 427/458 |
| 2012/0301981 A1 | 11/2012 | Ozgur et al. | |
| 2012/0304618 A1 | 12/2012 | Roy | |
| 2013/0098774 A1 | 4/2013 | Lozano et al. | |
| 2013/0113370 A1 | 5/2013 | Tabib-Azar et al. | |
| 2013/0187532 A1* | 7/2013 | Sharifi | C25F 3/02 313/310 |
| 2013/0228700 A1* | 9/2013 | Lozano | H01J 37/08 250/423 R |
| 2013/0241115 A1 | 9/2013 | Sharma et al. | |
| 2013/0256535 A1 | 10/2013 | Meijer et al. | |
| 2013/0319599 A1 | 12/2013 | Huang et al. | |
| 2014/0054809 A1* | 2/2014 | Lozano | H01J 37/08 264/28 |
| 2014/0110661 A1 | 4/2014 | Wang et al. | |
| 2014/0284406 A1* | 9/2014 | Brekenfeld | B05B 5/0255 239/696 |
| 2014/0292180 A1* | 10/2014 | Park | H01J 9/025 313/309 |
| 2014/0353397 A1 | 12/2014 | Velásquez-García et al. | |
| 2014/0353860 A1 | 12/2014 | Velásquez-García et al. | |
| 2015/0060757 A1 | 3/2015 | Lee et al. | |
| 2015/0061487 A1 | 3/2015 | Sharifi et al. | |
| 2015/0170865 A1 | 6/2015 | Lozano et al. | |
| 2015/0255241 A1 | 9/2015 | Bonam | |
| 2016/0096185 A1 | 4/2016 | Nobuo et al. | |
| 2016/0107178 A1* | 4/2016 | Velasquez-Garcia | B05B 1/14 239/3 |
| 2016/0111242 A1 | 4/2016 | Lozano et al. | |
| 2016/0297549 A1 | 10/2016 | Lozano et al. | |
| 2016/0318048 A1 | 11/2016 | Velásquez-Garcia et al. | |
| 2016/0365216 A1* | 12/2016 | Lozano | H01J 1/304 |
| 2016/0376150 A1 | 12/2016 | Lozano et al. | |
| 2017/0110284 A1 | 4/2017 | Lozano et al. | |
| 2018/0076003 A1 | 3/2018 | Lozano et al. | |
| 2019/0135457 A1* | 5/2019 | Lozano | B64G 1/405 |
| 2019/0157036 A1 | 5/2019 | Lozano et al. | |

FOREIGN PATENT DOCUMENTS

| | | |
|---|---|---|
| WO | WO 2007/002170 A2 | 1/2007 |
| WO | WO 2009/023257 A1 | 2/2009 |
| WO | WO 2009/039338 A1 | 3/2009 |
| WO | WO 2009/137583 A2 | 11/2009 |
| WO | WO 2011/079138 A2 | 6/2011 |
| WO | WO 2012/078043 A1 | 6/2012 |
| WO | WO 2013/003795 A1 | 1/2013 |
| WO | WO 2013/016497 A2 | 1/2013 |

OTHER PUBLICATIONS

International Preliminary Report on Patentability dated Dec. 10, 2015 for Application No. PCT/US2014/039851.
International Search Report and Written Opinion dated Sep. 15, 2015 for Application No. PCT/US2015/024827.
International Preliminary Report on Patentability dated Oct. 19, 2017 for Application No. PCT/US2015/024827.
International Search Report and Written Opinion dated Jun. 17, 2010 for PCT/US2009/042990.
International Preliminary Report on Patentability dated Nov. 18, 2010 for Application No. PCT/US2009/042990.
International Search Report and Written Opinion dated Mar. 21, 2014 for PCT/US2013/057067.
International Preliminary Report on Patentability dated Mar. 12, 2015 for Application No. PCT/US2013/057067.
International Search Report and Written Opinion dated Nov. 23, 2015 for PCT/US2015/021277.
International Preliminary Report on Patentability dated Nov. 10, 2016 for Application No. PCT/US2015/021277.
[No Author Listed], SEFAR, Common metal mesh configurations, Dutch Weaves. 2009; 2 pages.
Bennett, Spinning a yarn, nano-style—more affordable fibres. Materials World Magazine. The Institute of Materials, Minerals and Mining. Jan. 7, 2013. 2 pages. <www.iom3.org/news/spinning-yarn-nano-style-affordable-fibres> Last accessed Jun. 5, 2013.
Burger et al., Nanofibrous materials and their applications. Annu. Rev. Mater. Res. 2006;36:333-68. doi: 10.1146/annurev.matsci.36.011205.123537.
Carretero et al., Numerical simulation of Taylor cone-jets and colloid thruster plumes. 4th International Conference on Spacecraft Proprulsion, Cagliari, Italy. Jun. 2-4, 2004.
Chang et al., Continuous near-field electrospinning for large area deposition of orderly nanofiber patterns. Appl. Phys. Lett.2008; 93(2):123111. 3 pages. DOI: 10.1063/1.2975834.
Chiu et al., Mass spectrometric analysis of colloid thruster ion emission from selected propellants. Journal of Propulsion and Power. 2005;21(3):416-23.
Clampitt et al., Intense field-emission ion source of liquid metals. J of Vacuum Science and Technology. Nov./Dec. 1975;12 (6):1208.
Cleaver et al. A 100-Kv ion probe microfabrication system with a tetrode gun. Vacuum Sci and Technol. Nov./Dec. 1981;19(4): 1145-8.
Deitzel et al., Controlled deposition of electrospun poly( ethylene oxide) fibers Polymer No. 2001;42:8163-70.
Despois et al., Permeability of open pore microcellular materials. Acta Materialia. Elsevier, Oxford, GB. Mar. 2005; 53(5): 1381-8.
Doshi et al., Electrospinning process and applications of electrospun fibers. J Electrost. 1995;35:151-60.
Driesel et al., In situ observation of the tip shape of auge liquid alloy ion sources using a high voltage transmission electron microscope. J. Vac. Sci. Technol. B. 1996;14(5):3367-80.
Escher et al. Vacuum ion emission from solid electrolytes: an alternative source for focused ion beams. Applied Physics Letters. 2006;89: 053513-1 and 053513-2. 2 pages.
Fernandez De La Mora, The current emitted by highly conductive Taylor cones. J Fluid Mech. 1994;260:155-84.
Fernandez De La Mora, The fluid dynamics of Taylor cones. Annual Review of Fluid Mechanics. 2007; 39: 217-243. doi:10.1146/annurev.fluid.39.050905.110159.
Gassend et al., A microfabricated planar electrospray array ionic liquid ion source with integrated extractor. J. of Microelectromechanical Systems. Jun. 2009; 18(3):679-94.
Gassend et al., Precision in-plane hand assembly of bulk-microfabricated components for high voltage mems arrays applications. J of Microelectromechanical Systems. Apr. 2009;18(2):332-46.
Gibson et al., Transport properties of porous membranes based on electrospun fibers, Colloids and Surfaces A: Physicochemical and Engineering Aspects, No. 187-188, pp. 469-481 (2001).
Guharay et al., Characteristics of focused beam spots using negative ion beams from a compact surface plasma source and merits for new applications. Journal of Vacuum Science and Technology B. 1998; 16(6): 3370-3.
Guzdar et al., Charging of substrates irradiated by particle beams. Applied Physics Letters. Dec. 1, 1997; 71(22): 3302-4.
Hardesty, Making 'nanospinning' practical. MIT News Office. Nov. 20, 2012; 3 pages. <web.mit.edu/newsoffice/2012/making-nanospinning-practical-1120.html?tmpl=component&print=1> Last accessed May 31, 2013.
He et al., Magnetic and photomagnetic properties of polycrystalline wide-gap semiconductor Cd1-xMnxTe thin films. Journal of Electronic Materials. Feb. 1997;26(2):73-7.

(56) References Cited

OTHER PUBLICATIONS

Hemberger et al., Thermal transport properties of functionally graded carbon aerogels. Int J Thermophys. 2009;30:1357-71.
Hill et al., High-throughput ionic liquid electrospray sources based on dense monolithic arrays of emitters with integrated extractor grid and carbon nanotube flow control structures. Technical Digest of the 17th International Conference on Solid-State Sensors Actuators, and Microsystems. Barcelona, Spain. Jun. 16-20, 2013. 2644-7.
Ishino et al., Wicking within forests of micropillars, Europhysics Letters. Sep. 2007; 79:56005. 5 pages. doi: 10.1209/0295-5075/79/56005.
Kobayashi et al., Growth of large-diameter (4nm) single-wall carbon nanotubes in the nanospace of mesoporous material SBA-15. Carbon. 2011;49:5173-9.
Krpoun et al., Tailoring the hydraulic impedance of out-of-plane micromachined electrospray sources with integratedelectrodes. Appl. Phys. Lett., vol. 94, 2009.
Larriba et al., Monoenergetic source of kilodalton ions from Taylor cones of ionic liquids. Journal of Applied Physics. 2007; 101: 084303-1 to 084303-6.
Larrondo et al., Electrostatic fiber spinning from polymer melts—1. Experimental-observations on fiber formation and properties, J Polym. Sci. B 1No. 9, pp. 909-920 (1981).
Larsen et al., Use of coaxial gas jackets to stabilize Taylor cones of volatile solutions and to induce particle-to-fiber transitions. Adv Mater. 2004;16(2): 166-69.
Lee et al., Developing protective textile materials as barriers to liquid penetration using melt electrospinning, Journal of Applied Polymer Science.2006; 102: 3430-7. DOI 10.1002/app.24258.
Legge et al., 18.086 Final Project: Finite Element Modelling of Ionic Liquid Flow Through Porous Electrospray Emitters. May 14, 2008.
Legge et al., Fabrication and characterization of porous metal emitters for electrospray thrusters. IEPC-2007-145 Proc. 30th International Electric Proulsion Conference, Florence, Italy, Sep. 17-20, 2007.
Legge et al., Electrospray propulsion based on emitters microfabricated in porous metals, J. Propul. Power, vol. 27, pp. 485-494, 2011.
Legge, Fabrication and characterization of porous metal emitters for electrospray applications. Brown University (Mechanical Engineering): Department of Aeronautics and Astronautics. May 18, 2008. 140 pages.
Li et al. The focused-ion-beam-microscope-more than a precision ion milling machine. JOM. 2006; 58 (3): 27-31.
Li et al., Electrospinning of nanofibers: reinventing the wheel? Advanced Materials. 2004;16:1151-70.
Lin et al., Preparation of poly( ether sulfone) nanofibers by gas-jet/electrospinning. Journal of Applied Polymer Science. 2008;107: 909-17. DOI 10.1002/app.26445.
Lozano et al., Electrospray emission from nonwetting flat dielectric surfaces. Journal of Colloid and Interface Science. 2004;276(2): 392-9.
Lozano et al., Energy properties of an EMI-IM ionic liquid ion source. J Phys. D: Appl Phys. 2006;39: 126-34. doi:10.1088/0022-3727/39/1/020.
Lozano et al., Experimental Measurements of Colloid Thurster plumes in the Ion-Droplet Mixed Regime. (AIAA-3814) 38th Joint Propulsion Conference. Indianapolis, Indiana. Jul. 7-10, 2002; 1-6.
Lozano et al., Ionic liquid ion sources: characterization of externally wetted emitters, J. Colloid Interf. Sci. 2005; 282: 415-21.
Lozano et al., Ionic liquid ion sources: suppression of electrochemical reactions using voltage alternation. J. Colloid Interf. Sci. 2004; 280: 149-54.
Lozano et al., On the dynamic response of externally wetted ionic lisquid ion sources. J. Phys. D.: Appl Phys. 2005; 38(14):2371-7.
Lozano et al., Performance characteristics of linear ionic liquid electrospray thruster. IEPC-2005-192. 29th International Electric Propulsion Conference. Princeton University (USA). Oct. 31-Nov. 4, 2005;6pgs.

Lukas et al., Self-organization of jets in electrospinning from free liquid surface: A generalized approach J. Appl. Phys. 2008;103:084309. 7 pgs. doi: 10.1063/1.2907967.
McEwen et al., Electrochemical properties of imidazolium salt electrochemical capacitor applications. J. Electrochem Soc. 1999;146(5): 1687-95.
Muhle et al., A time-of-flight spectrometer for investigations on liquid metal ion sources. J. Phys. D: Appl Physics.1999;32(2): 161-7.
Paruchuri et al., Splitting of a liquid jet. Phys. Rev. Lett. Mar. 30, 2007; 98:134502. 4 pages.
Petrik et al., Production nozzle-less electrospinning nanofiber technology. MRS Proceedings. 1240 1240-WW03-07. 2009. 12 pgs. doi:10.1557/Proc-1240-WW03-07.
Podenok, Electric field enhancement factors around a metallic, end-capped cylinder. NANO: Brief Reports and Reviews. 2006; 1(1):87-93.
Ponce De Leon et al., Batch-microfabricated arrays of electrospinning emitters for high throughput generation of nanofibers. Technical Digest of the 12th International Workshop on Micro and Nanotechnology for Power Generation and Energy Conversion Applications. Atlanta GA, USA. Dec. 2-5, 2012; 227-30.
Prewett et al., Focused ion beams from liquid metal ion sources. Research Studies Press. 1991; 19-30, 78-101 and 151-74.
Quéré, Wetting and roughness. Annu. Rev. Mater. Res. 2008;38:71-99.
Reneker et al., Electrospinning jets and polymer nanofibers. Polymer. 2008; 49: 2387-2425. doi:10.1016/j.polymer.2008.02.002.
Romero-Sanz et al., Source of heavy molecular ions based on Taylor cones of ionic liquids operating in the pure ion evaporation regime, J. Appl. Phys. 2003; 94: 3599-605.
Scipioni et al., Performance of multicusp plasma ion sources for focused ion beam applications. Journal of Vacuum Science and Technology B. 2000; 18(6). 3194-7.
Seiwert et al., Coating of a textured solid. J. Fluid Mech. 2011;669: 55-63. doi:10.1017/S0022112010005951.
Smith et al. High brightness inductively coupled plasma source for high current focused ion beam applications. Journal of Vacuum Science and Technology B.2006;24(6): 2902-6.
Srinivasan et al., Structure and morphology of small diameter electrospun aramid fibers. Polymer International. 1995; 36: 195-201.
Srivastava et al., Multi jet electrospinning of conducting nanofibers from microfluidic manifolds. J Appl. Polymer Sci. 2007; 106: 3171-8.
Suzuki et al., Contrast differences between scanning ion and scanning electron microscope images. Journal Vacuum Science and Technology A. 2004; 22(1): 49-52.
Swanson et al., Emission characteristics of gallium and bismuth liquid metal ion sources. J. Vac. Sci. Technol. Nov./Dec. 1979; 16(6): 1864-9.
Szilagyi et al., Electron and Ion Optics, Plenum Press. 1988. 216-50 and 251-63.
Taylor, Disintegration of water drops in an electric field. Proc. R. Soc. London A.1964;280: 383-397.
Teo et al., Uniform patterned growth of carbon nanotubes without surface carbon, Appl. Phys. Lett. 2001; 79: 1534-1536.
Thavasi et al., Electrospun Nanofibers in Energy and Environmental Applications. Energy Environ. Sci. 1 205-221. (2008).
Theron et al., Multiple jets in electrospinning: experiment and modeling, Polymer. 2005; 46:2889-99. doi:10.1016/j.polymer.2005. 01.054.
Tomaszewski et al., Investigation of electrospinning with the use of a multi jet electrospinning head. Fibres & Textiles in Eastern Europe. Oct./Dec. 2005; 13(4): 22-6.
Tseng et al. Recent developments in nanofabrication using focused ion beams. Small. 2005. 1(10):924-39. DOI: 10.1002/smll. 200500113.
Vaseashta, Controlled formation of multiple Taylor cones in electrospinning process, Applied Physics Letters. 2007; 90(9): 093115. 3 pgs.
Velasquez-Garcia et al., A Micro-fabricated linear array of electrospray emitters for thruster applications. J. of Microelectromechanical Systems. Oct. 2006; 15(5): 1260-71.

(56) References Cited

OTHER PUBLICATIONS

Velasquez-Garcia et al., A planar array of micro-fabricated electrospray emitters for thruster applications. J. of Microelectromechanical Systems. Oct. 2006; 15(5):1272-1280.

Velasquez-Garcia et al., an application of 3-D MEMS packaging: out-of-plane quadrupole mass filters. Journal of Microelectromechanical Systems. Dec. 2008;17(6):1430-8.

Velasquez-Garcia et al., CNT-based MEMS/NEMS gas ionizers for portable mass spectrometry applications. J. of Microelectromechanical Systems. Jun. 2010; 19 (3):484-93. Doi: 10.1109/JMEMS.2010.2045639.

Velásquez-García et al., Fabrication of large arrays of high-aspect-ratio single-crystal silicon columns with isolated vertically aligned multi-walled carbon nanotube tips. Nanotechnology. Oct. 8, 2008;19(40):405305. doi:10.1088/0957-4484/19/40/405305.

Velasquez-Garcia et al., Precision hand assembly of MEMS subsystems using DRIB-patterned deflection Spring Structures: An Example of an Out-of-plane Substrate Assembly.J of Microelectromechanical Systems. Jun. 2007; 16(3):598-612. Doi: 10.1109/JMEMS.2007.892931.

Velásquez-García et al., SLA 3-D Printed Arrays of Miniaturized, Internally Fed, Polymer Electrospray Emitters. J of Microelectromechanical Systems. Dec. 2015;24(6):2117-2127, doi: 10.1109/JMEMS.2015.2475696.

Xiao et al., Prediction and optimization of liquid propagation in micropillar arrays. Langmuir. Oct. 2010; 26(19):15070-5. doi: 10.1021/la102645u.

Yamashita et al., Characteristics of elastomeric nanofiber membranes produced by electrospinning. Journal of Textile Engineering. Jan. 2007; 53(4):137-42. doi: 10.4188/jte.53.137.

Yang et al., Multiple Jets in Electrospinning Proceedings of the 8th International conference on properties and applications of dielectric materials, pp. 940-943 (2006).

Yang et al., Research Progress in Preparation and Application of Gradient-Porous Metal. Apr. 2008. Powder Metallurgy Industry. 18(7).

Yarin et al., Upward needleless electrospinning of multiple nanofibers. Polymer. Apr. 2004; 45(9): 2977-80. doi: 10.1016/j.polymer.2004.02.066.

Zeng et al., Influence of property gradient on the behavior of cellular materials subjected to impact loading. AIP Conference Proceedings. AIP USA. Feb. 15, 2008;18:9-15.

Zhou et al., Gas flow-assisted alignment of super long electrospun nanofibers. J Nanosci. Nanotechnol. 2007; 7(8): 2667-73.

Zhou et al., Mass production of nanofiber assemblies by electrospinning, Polym Int, 2009; 58: 331-342. DOI 10.1002/pi.2521.

Zong et al., Control of structure, morphology and property in electrospun poly(glycolide-co-lactide) non-woven membranes via post-draw treatments. Polymer. 2003; 44:4959-67.

\* cited by examiner

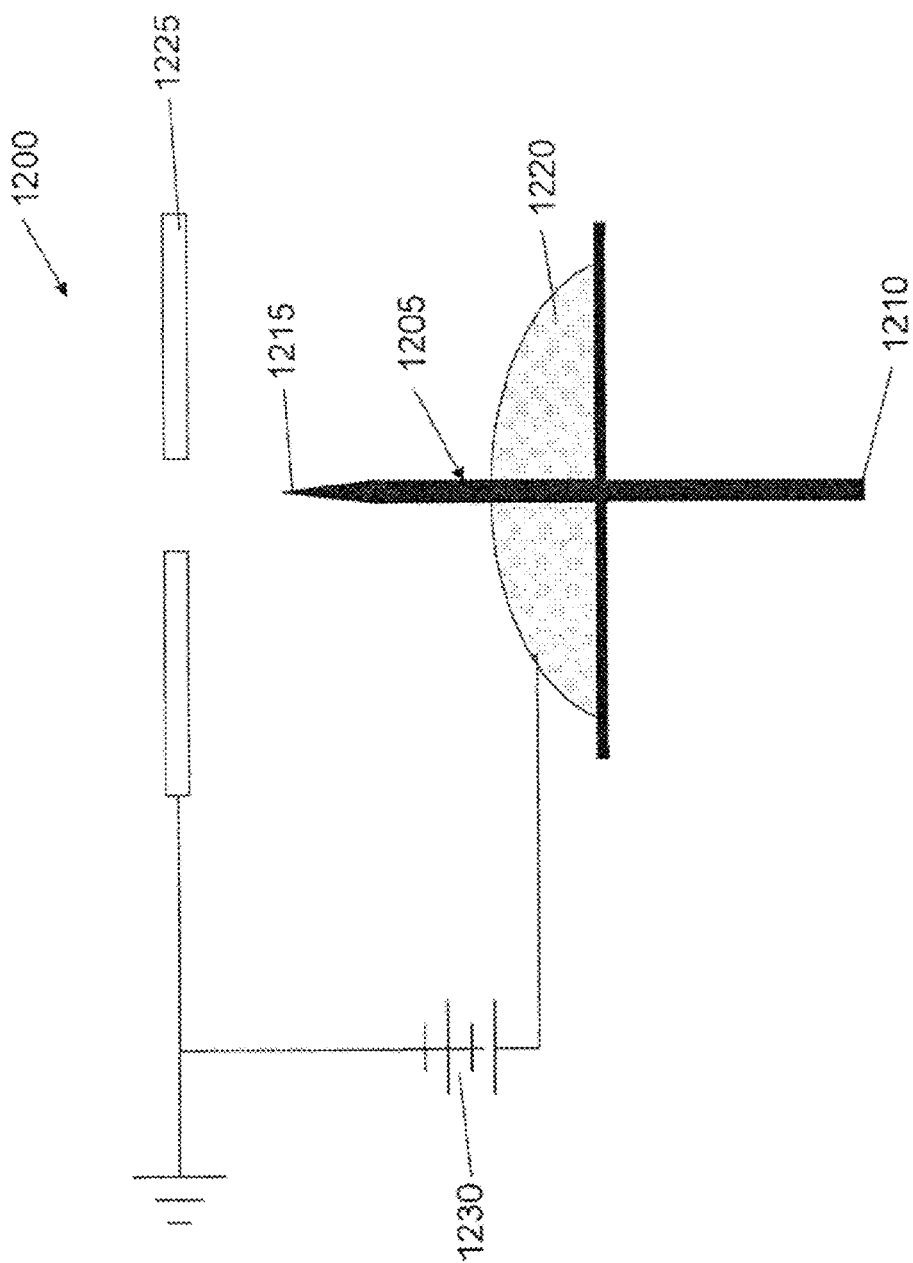

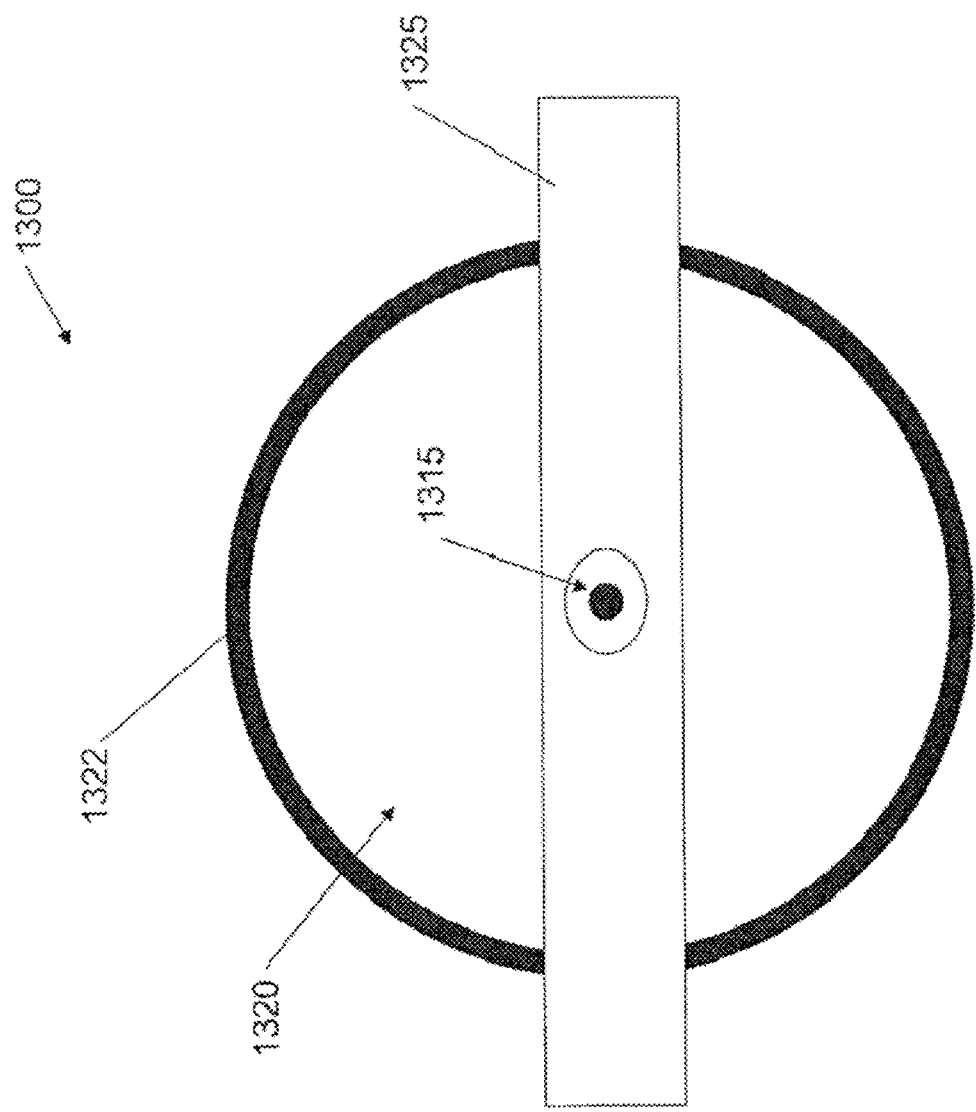

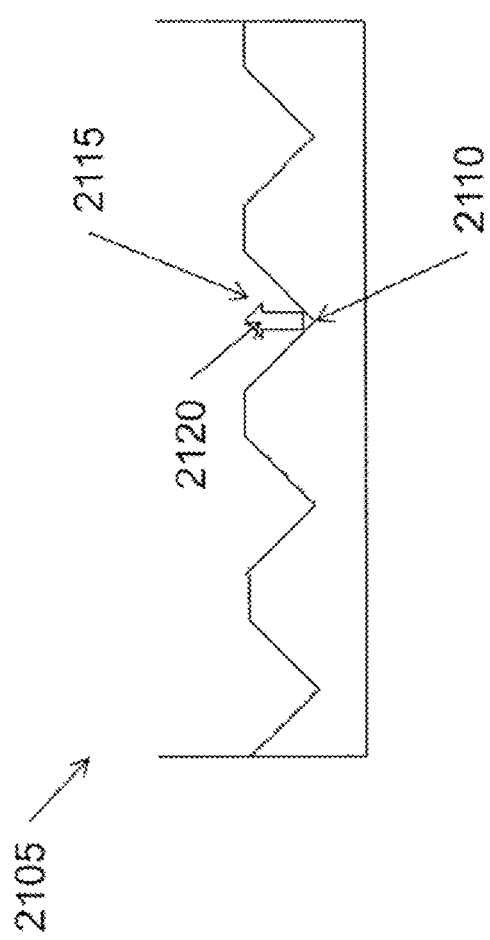

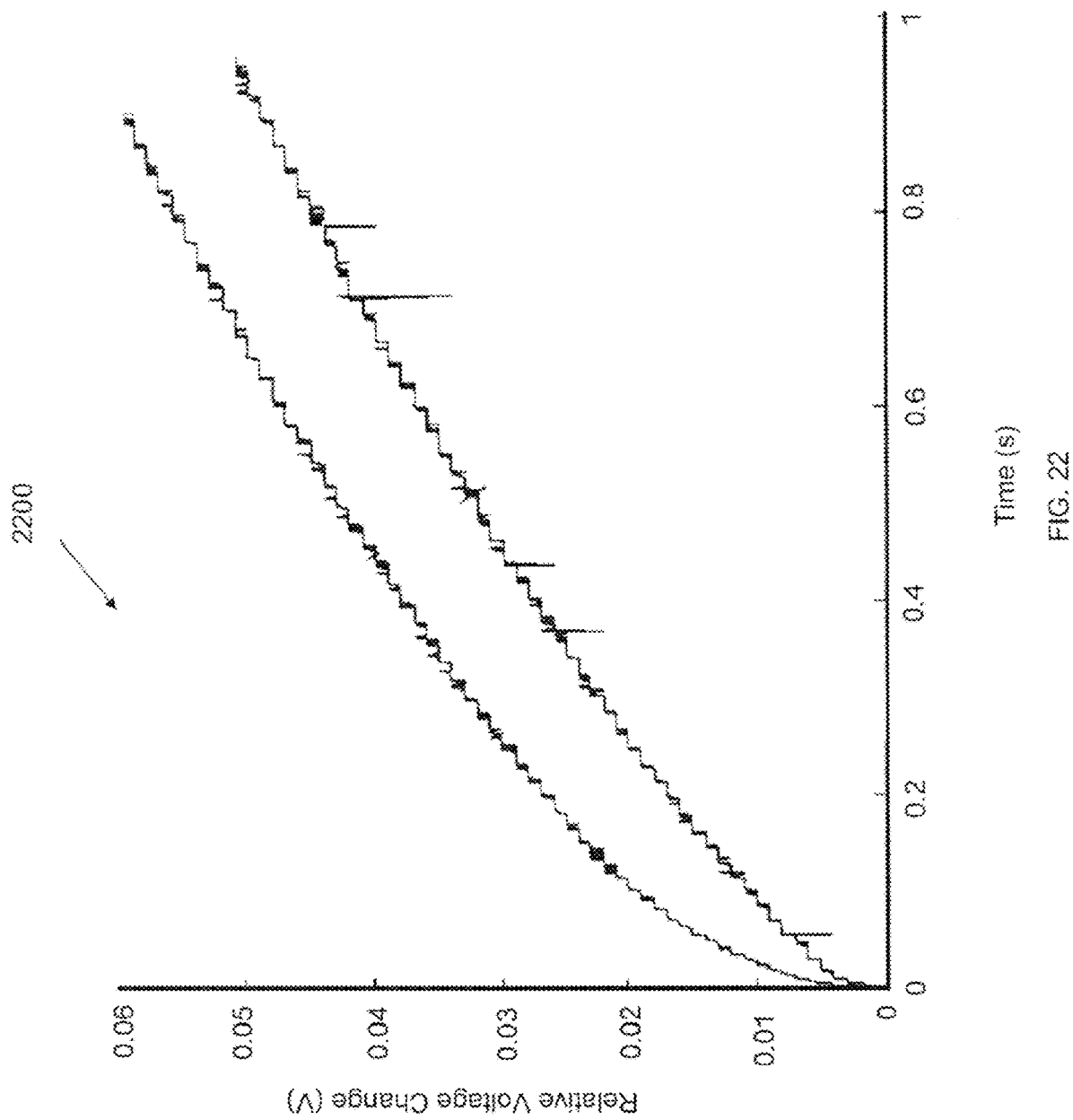

METHOD AND APPARATUS FOR A POROUS ELECTROSPRAY EMITTER

CROSS-REFERENCE TO RELATED APPLICATION

This application is a continuation of U.S. application Ser. No. 16/257,786, filed Jan. 25, 2019, which is a continuation of U.S. application Ser. No. 15/805,050, filed Nov. 6, 2017, which is a continuation of U.S. application Ser. No. 15/272,574, filed Sep. 22, 2016, which is a continuation of U.S. application Ser. No. 14/336,814, filed Jul. 21, 2014, which is a continuation of U.S. application Ser. No. 14/070,351, filed Nov. 1, 2013, which is a continuation-in-part-of—U.S. application Ser. No. 13/839,064, filed Mar. 15, 2013, which is a continuation-in-part of U.S. patent application Ser. No. 13/681,155, filed on Nov. 19, 2012, which is a continuation of U.S. patent application Ser. No. 12/990,923, filed on May 3, 2011, which is a national stage filing under 35 U.S.C. § 371 of International Application No. PCT/US2009/042990, filed on May 6, 2009, which claims the benefit of priority under 35 U.S.C. § 119(e) to U.S. Provisional Patent Application No. 61/050,847 filed on May 6, 2008, the contents of each of which are incorporated herein by reference in their entirety. U.S. application Ser. No. 13/839,064, filed Mar. 15, 2013, also claims the benefit of priority under 35 U.S.C. § 119(e) to U.S. Patent Application No. 61/695,034, filed Aug. 30, 2012, the contents of which are incorporated herein by reference in their entirety.

GOVERNMENT SUPPORT

This invention was made with Government support under Grant No. FA2386-11-1-4074 awarded by the Asian Office of Aerospace Research and Development. The Government has certain rights in the invention.

FIELD OF THE INVENTION

The technology generally relates to devices and methods of generating ions. More specifically, the invention relates to methods and devices for an electrospray emitter.

BACKGROUND OF THE INVENTION

Existing colloid thrusters utilize pressure fed capillary emitter geometry to transport liquid to the base of Taylor Cones. FIG. 1 shows a schematic of Taylor Cone formation from a pressure fed capillary emitter. A voltage can be applied to a capillary emitter 10, relative to an electrode 20. The balance between surface tension and electric pressure forms a Taylor Cone 30 and generates emission of ions 40. Droplets can be emitted, due to instability, at apex of cone 50. Droplets can carry most of the ejected mass (i.e., since droplets are relatively heavy) while delivering little impulse (i.e., as droplets move relatively slowly). This can translate into inefficient operation. In ion beam etching, droplets can also contaminate the substrate.

Pressure fed capillary emitters, however, can require pressurization systems (e.g., onboard the spacecraft using the emitters), that adds mass/weight and complexity to the system. The difficulties in fabricating small, uniform capillaries can pose problems in the miniaturization of needle arrays. One way to avoid the issues of pressure fed capillary emitters is to use externally wetted emitter geometries where liquid is drawn from a reservoir by capillary forces. Such passively fed systems can supply liquid at the rate established by the electrospray emission process. The use of externally fed emitters in vacuum, however, is possible with ionic liquids.

Ionic liquids (ILs) are molten salts at room temperature and exhibit extremely low vapor pressures. ILs are formed by positive and negative ions which can be directly extracted and accelerated to produce thrust when used in bipolar operation. ILs have been shown to emit a purely ionic current when exposed to a strong applied potential. ILs generate a substantially pure ionic emission and have a relatively low starting voltage (e.g., less than approximately 2 kV required to generate ions from the Taylor Cone). ILs allow for a scalable specific impulse of the electrospray emitter(s) from approximately 500 seconds to 5000+ seconds. Some ILs can display super-cooling tendencies in which they remain as liquids well below their nominal freezing points. Just as their inorganic cousins (simple salts like NaCl, KBr, etc.) at their melting points (typically >850° C.), ILs exhibit appreciable electrical conductivity at room temperature, making them suitable for electrostatic deformation and subsequent Taylor Cone formation. ILs are thermally stable over a wide range of temperatures (they do not boil, but decompose at temperatures ~250-500° C.) and are apparently non-toxic being able to be used with applications with green standards, such as in the synthesis and catalysis of chemical reactions. ILs can be used in electrochemical systems, such as in high energy density supercapacitors. ILs' electrochemical window (i.e., the maximum potential difference sustainable by the liquid before electrochemical reactions are triggered) is higher than in conventional aqueous solutions. ILs have low vapor pressures at, or moderately above, their melting points. This allows for use in high vacuum equipment in open architectures such as externally wetted needles/emitters.

Ion sources using ILs can produce positive or negative ion beams with: (1) narrow energy distributions, (2) high brightness, (3) small source size, and (4) wide selection of liquids with diverse molecular compositions. IL ionic sources can be used as a simple and compact source of nearly-monoenergetic negative ions, which can reduce the charge build-up that limits the ability to focus non-neutralized positive ion beams onto dielectrics (insulators or some biological samples) or conductive, but electrically floating targets, and act as a chemically reactive etch agent for materials micro- and nanoprocessing applications.

SUMMARY OF THE INVENTION

Porous metal Electrospray emitters have been shown to emit more current than a comparably sized solid externally wetted emitter (e.g., needle), due to the increased capillary flow capacity (e.g., greater flow through volume) provided by the volumetric porosity of the emitter substrate. Porous metal emitters also have the benefit of being a passive, self-regulating capillary supply that reduces complexity over pressure fed capillary systems coupled with the benefit of increased flow through volume that permits the porous metal emitters to emit greater current and provide greater thrust. A typical thrust of a single porous metal emitter operating in the ionic mode can be about 0.05-0.1 µN/µA. Passively fed porous metal Electrospray emitters can emit purely in the ionic regime, which allows for high specific impulse (high ISP) operation and high polydispersive efficiency. Multiple emitters can be grouped to produce a desired amount of current, for example, in space applications. Micro-fabrication techniques can be used to manufacture a single emitter or an array of emitters. Porous metal electrospray emitters can be manufactured using, for example, photolithography and electrochemical etching.

In one aspect, an ionic liquid ion source includes a microfabricated body including a base and a tip and formed of a porous metal compatible (e.g., does not react or result in electrochemical decaying or corrosion) with at least one of an ionic liquid, or room-temperature molten salt. The microfabricated body can have a pore size gradient that decreases from the base of the body to the tip of the body, such that the ionic liquid is capable of being transported through capillarity from the base to the tip.

In another aspect, an ionic liquid ion source includes a plurality of emitters microfabricated from a porous metal compatible with at least one of an ionic liquid, or room-temperature molten salt. Each emitter can have a pore size gradient that decreases from the base of the emitter to the tip of the emitter, such that the ionic liquid is capable of being transported through capillarity from the base to the tip of each emitter.

In yet another aspect, a system for producing ions includes a source of at least one of ionic liquid or room-temperature molten salt and an array of emitters microfabricated from a porous metal compatible with the at least one of ionic liquid or room-temperature molten salt, where each emitter can have a pore size gradient that decreases from the base of the emitter to the tip of the emitter such that the ionic liquid is capable of being transported through capillarity from the base to the tip of each emitter. The system can also include an electrode positioned downstream relative to the array of emitters and a power source for providing a voltage to the array of emitters with respect to the electrode.

In another aspect, a method for manufacturing an array of electrospray emitters can include applying polyimide to a first side of a sample comprising a porous metal compatible with an ionic liquid, applying photoresist to the first side of the sample and applying a transparency mask to the first side of the sample and exposing the sample to UV light to form an emitter geometry pattern. The method can also include removing the photoresist from the sample, curing the sample to harden the polyimide, electrochemically etching the sample to form an emitter geometry and removing the polyimide resulting in an array of electrospray emitters. The method can include the step of treating and/or processing a tip of each emitter to vary a pore size between each tip and each base of each emitter in the array.

In yet another aspect, a method for manufacturing an ion emitter can include forming a body from a porous metal compatible with at least one of an ionic liquid or room temperature molten salt, the body having a pore size gradient that decreases from a first end of the body to a second end of the body. The method can also include microfabricating the body to form a base relative to the first end of the body and a tip relative to the second end of the body, wherein the ionic liquid is capable of being transported through capillarity from the base to the tip.

In another aspect, a method for manufacturing an ion source can include forming an emitter geometry pattern on a unitary substrate comprising a porous metal compatible with at least one of an ionic liquid, or room-temperature molten salt. The method can also include electrochemically etching the unitary substrate to form a plurality of emitters, where each emitter comprises a base at the first end of the substrate and a tip at the second end of the substrate. A tip of each emitter can be processed/treated to form a pore size gradient that varies from the base to the tip of each emitter.

In another aspect, an ionic liquid ion source includes a body including a base and a tip and formed of a porous material compatible with at least one of an ionic liquid or room-temperature molten salt, the body having a pore size gradient that decreases from the base of the body to the tip of the body, such that the at least one of an ionic liquid or room-temperature molten salt is capable of being transported through capillarity from the base to the tip.

In another aspect, an ionic liquid ion source includes a plurality of emitters formed of a porous material compatible with at least one of an ionic liquid or room-temperature molten salt, each emitter of the plurality of emitters having a pore size gradient that decreases from a base of the emitter to a tip of the emitter, such that the at least one of an ionic liquid or room-temperature molten salt is capable of being transported through capillarity from the base to the tip of each emitter.

In another aspect, a system for producing ions includes a source of at least one of an ionic liquid or room-temperature molten salt. The system includes an array of emitters formed of a porous material compatible with the at least one of an ionic liquid or room-temperature molten salt, each emitter having a pore size gradient that decreases from a base of the emitter to a tip of the emitter such that the at least one of an ionic liquid or room-temperature molten salt is capable of being transported through capillarity from the base to the tip of each emitter. The system includes an electrode positioned downstream relative to the array of emitters. The system includes a power source for providing a voltage to the array of emitters with respect to the electrode.

In another aspect, an ionic liquid ion source includes an emitter body formed of a porous material, the emitter body externally wetted by at least one of an ionic liquid or room-temperature molten salt. The ionic liquid ion source includes an electrode electrically connected to the emitter body via the at least one of an ionic liquid or room-temperature molten salt.

In another aspect, a system for producing ions includes a source of at least one of an ionic liquid or room-temperature molten salt. The system includes a first electrode in contact with the ionic liquid or room-temperature molten salt, the first electrode formed of a first porous material compatible with the at least one of an ionic liquid or room-temperature molten salt. The system includes a connecting member adjacent to the first electrode, the connecting member formed of a second porous material compatible with the at least one of an ionic liquid or room-temperature molten salt. The system includes an array of emitters adjacent to the connecting member, the array of emitters formed of a third porous material compatible with the at least one of an ionic liquid or room-temperature molten salt. In the system, the first electrode, the connecting member, and the array of emitters have a pore size gradient that decreases from the first electrode to the array of emitters such that the at least one of an ionic liquid or room-temperature molten salt is capable of being transported through capillarity from the first electrode, through the at least a portion of the connecting member, and to the array of emitters.

In another aspect, a method for manufacturing an array of electrospray emitters includes forming a substrate from a porous material compatible with at least one of an ionic liquid or room temperature molten salt, the substrate having a pore size gradient that decreases from a first end of the body to a second end of the body. The method includes processing the substrate to form one or more emitters, wherein each emitter of the one or more emitters comprises a base and a tip formed of the substrate, the base relative to the first end of the substrate and the tip relative to the second end of the substrate, and wherein the ionic liquid is capable of being transported through capillarity from the base to the tip.

In another aspect, a method for manufacturing an array of electrospray emitters includes forming a substrate from a first porous material compatible with at least one of an ionic liquid or room temperature molten salt. The method includes selectively depositing a second porous material compatible with the at least one of an ionic liquid or room temperature molten salt onto the substrate to form one or more emitters, wherein each emitter of the one or more emitters comprises a base and a tip, wherein the ionic liquid is capable of being transported through capillarity from the base to the tip.

In other examples, any of the aspects above, or any apparatus or method described herein, can include one or more of the following features.

In some embodiments, ionic liquid is capable of being continuously transported through capillarity from the base of a microfabricated body to the tip of the microfabricated body. The body can be a cylindrical needle. In some embodiments, the body is a flat ribbon-like needle. The tip of the microfabricated body can be formed by electrochemical etching. In some embodiments, a radius of curvature of the tip is about 1-20 µm.

In some embodiments, the porous metal is at least one of tungsten, nickel, magnesium, molybdenum or titanium.

In some embodiments, an ion source includes a plurality of emitters and ionic liquid is capable of being continuously transported through capillarity from the base to the tip of each emitter. The emitters can be formed by electrochemical etching. In some embodiments, a spacing between the emitters is less than about 1 mm. In some embodiments, a system for producing ions includes an array of emitters and ionic liquid is capable of being continuously transported through capillarity from the base to the tip of each emitter.

In some embodiments, the porous material includes a dielectric material. In some embodiments, the dielectric material includes at least one of a ceramic material, a glass material or another oxide material. In some embodiments, the metal material includes at least one of tungsten, nickel, magnesium, molybdenum or titanium. In some embodiments, the third porous material includes a metal material. In some embodiments, the metal material includes at least one of silver, stainless steel, tungsten, nickel, magnesium, molybdenum, titanium, any combination thereof, or any thereof coated with a noble metal material. In some embodiments, the third porous material includes a dielectric material. In some embodiments, the dielectric material includes at least one of a ceramic material, a glass material or another oxide material. In some embodiments, the first porous material includes at least one of silver, stainless steel, tungsten, nickel, magnesium, molybdenum, titanium, any combination thereof, or any thereof coated with a noble metal material. In some embodiments, the system for producing ions includes an extraction grid positioned downstream relative to the array of emitters. In some embodiments, the system for producing ions includes an accelerator grid positioned downstream relative to the extraction grid.

A method for manufacturing an array of emitters can include filling the porous metal with photoresist and exposing the porous metal with a UV light to block pores of the porous metal to form the sample. In some embodiments, the method includes blocking the porous metal surface by the uniform deposition of mono-layers of a compatible material (e.g., compatible with the ionic liquids and the porous metal substrate and does not react or result in electrochemical decaying or corrosion) using Chemical Vapor Deposition (CVD) or Physical Vapor Deposition (PVD). The step of applying polyimide to the first side of the sample can include prebaking the sample. The method can include developing the sample to transfer the emitter geometry pattern by removing positive photoresist and etching the polyimide.

In some embodiments, electrochemically etching the sample includes the step of removing excess porous metal to form the emitter geometry. The step of electrochemically etching the sample can include etching the sample to form a conical emitter geometry. In some embodiments, the porous metal is at least one of tungsten, magnesium, molybdenum, titanium or nickel.

The method for manufacturing an ion emitter can include microfabricating a body to form a base and a tip. In some embodiments, the ionic liquid is capable of being continuously transported through capillarity from the base to the tip. Microfabricating the body can include shaping the body into a flat ribbon-like needle.

A surface of the tip of an emitter (e.g., one or more emitters in an array) can be treated/processed by applying a layer of compatible metal (e.g., a porous layer of metal compatible with the ionic liquids and the porous metal substrate that does not react or result in electrochemical decaying or corrosion) or other readily condensable metal to the porous metal emitter (e.g., on the surface at or substantially near the tip of the emitter). For example, a layer of zinc can be applied to a porous tungsten emitter. A surface of the tip of an emitter (e.g., an emitter in an array) can also be treated/processed by attaching carbon nanotubes to a surface of each emitter at or substantially near the tip of the emitter(s) (e.g., so that a pore size at the tip of each emitter is smaller than a pore size at a base of each emitter).

In another aspect there is a method of forming one or more emitter bodies made of porous ceramic xerogel. The method includes preparing a gel solution comprising a solvent, an acidic aluminum salt, a polymer, and a proton scavenger. The method includes providing a mold for one or more emitter bodies, each emitter body of the one or more emitter bodies comprising a base and a tip. The method includes pouring the gel solution into the mold. The method includes drying the gel solution in the mold to form the one or more emitter bodies made from the porous ceramic xerogel.

In some embodiments, the method can include mixing aluminum chloride hexahydrate, polyethylene oxide, water, ethanol, and propylene oxide to form the gel solution. In some embodiments, the method can include mixing 1 part by mass of polyethylene oxide, 50 parts by mass water, 54.4 parts by mass ethanol, 54.4 parts by mass propylene oxide, and 54 parts by mass of aluminum chloride hexahydrate to form the gel solution. In some embodiments, the method can include forming the mold from one or more of polydimethylsiloxane (PDMS), polytetrafluoroethylene (PTFE), polymers, fluoropolymers, paraffin wax, silica, glass, aluminum, and stainless steel. In some embodiments, the porous ceramic xerogel is alumina xerorgel. In some embodiments, the porous ceramic xerogel comprises pores approximately 3-5 µm in diameter.

In another aspect there is a method of forming one or more emitter bodies made from porous ceramic material. The method includes preparing a slurry of at least silica, water, and a ceramic component. The method includes providing a mold for one or more emitter bodies, each emitter body of the one or more emitter bodies comprising a base and a tip. The method includes pouring the slurry into the mold. The method includes freezing the slurry in the mold to form a frozen slurry. The method includes freeze drying the frozen slurry to form the one or more emitter bodies made from the porous ceramic material.

In some embodiments, the method can include low-temperature sintering the one or more emitter bodies. In some embodiments, the ceramic component comprises alumina. In some embodiments, the slurry further comprises one or more of ethanol, isopropanol, and glycerol. In some embodiments, the method can include forming the mold from one or more of polydimethylsiloxane (PDMS), polytetrafluoroethylene (PTFE), polymers, fluoropolymers, paraffin wax, silica, glass, aluminum, and stainless steel. In some embodiments, the porous ceramic material comprises pores approximately 3-50 µm in diameter. In some embodiments, the method can include freezing the slurry in the mold to form the frozen slurry by applying a temperature gradient to the slurry such that the temperature increases from an emitter tip portion of the mold to an emitter base portion of the mold.

In another aspect there is a method of forming one or more emitter bodies made from porous ceramic material. The method includes preparing a gel solution comprising a solvent, an acidic aluminum salt, a polymer, and a proton scavenger. The method includes drying the solution in the mold to form a porous ceramic xerogel. The method includes grinding the porous ceramic xerogel to form ground porous ceramic xerogel. The method includes preparing a slurry of at least silica, water, and the ground porous ceramic xerogel. The method includes providing a mold for one or more emitter bodies, each emitter body of the one or more emitter bodies comprising a base and a tip. The method includes pouring the slurry into the mold. The method includes freezing the slurry in the mold to form a frozen slurry. The method includes freeze drying the frozen slurry to form the one or more emitter bodies made from the porous ceramic material.

In some embodiments, the method can include low-temperature sintering the one or more emitter bodies. In some embodiments, the slurry further comprises one or more of ethanol, isopropanol, and glycerol. In some embodiments, the method can include forming the mold from one or more of polydimethylsiloxane (PDMS), polytetrafluoroethylene (PTFE), polymers, fluoropolymers, paraffin wax, silica, glass, aluminum, and stainless steel. In some embodiments, the porous ceramic material comprises pores approximately 3-50 µm in diameter. In some embodiments, the method can include grinding the porous ceramic xerogel into particles less than approximately 3-50 µm in diameter to form ground porous ceramic xerogel. In some embodiments, the method can include freezing the slurry in the mold to form the frozen slurry by applying a temperature gradient to the slurry such that the temperature increases from an emitter tip portion of the mold to an emitter base portion of the mold.

Other aspects and advantages of the invention can become apparent from the following drawings and description, all of which illustrate the principles of the invention, by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIG. 12 is a schematic of an ion source, according to an illustrative embodiment of the invention.

FIGS. 13A and 13B are schematics of an ion source, according to an illustrative embodiment of the invention.

FIG. 21 is a schematic of a mold for emitter bodies.

FIG. 22 is a graph showing the relative variation of the emitter voltage immediately after polarity reversal.

DETAILED DESCRIPTION OF THE INVENTION

Figure 1:
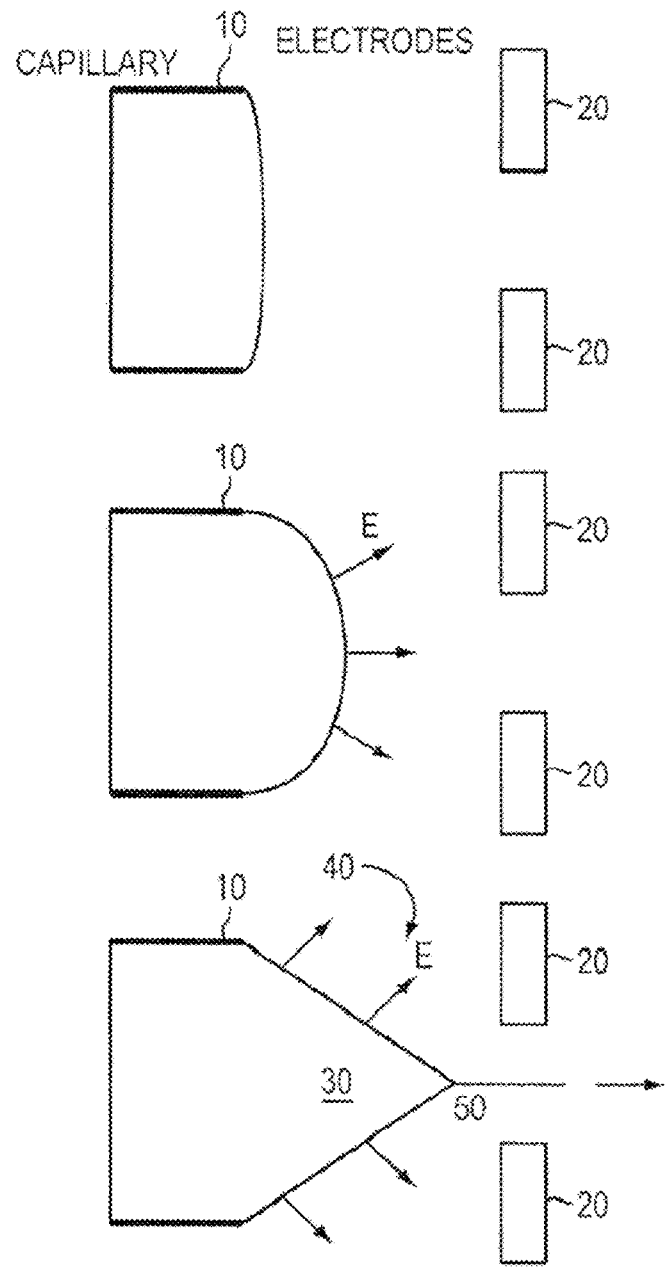
FIG. 1 is a schematic of Taylor Cone formation from a pressure fed capillary emitter.
Figure 2:
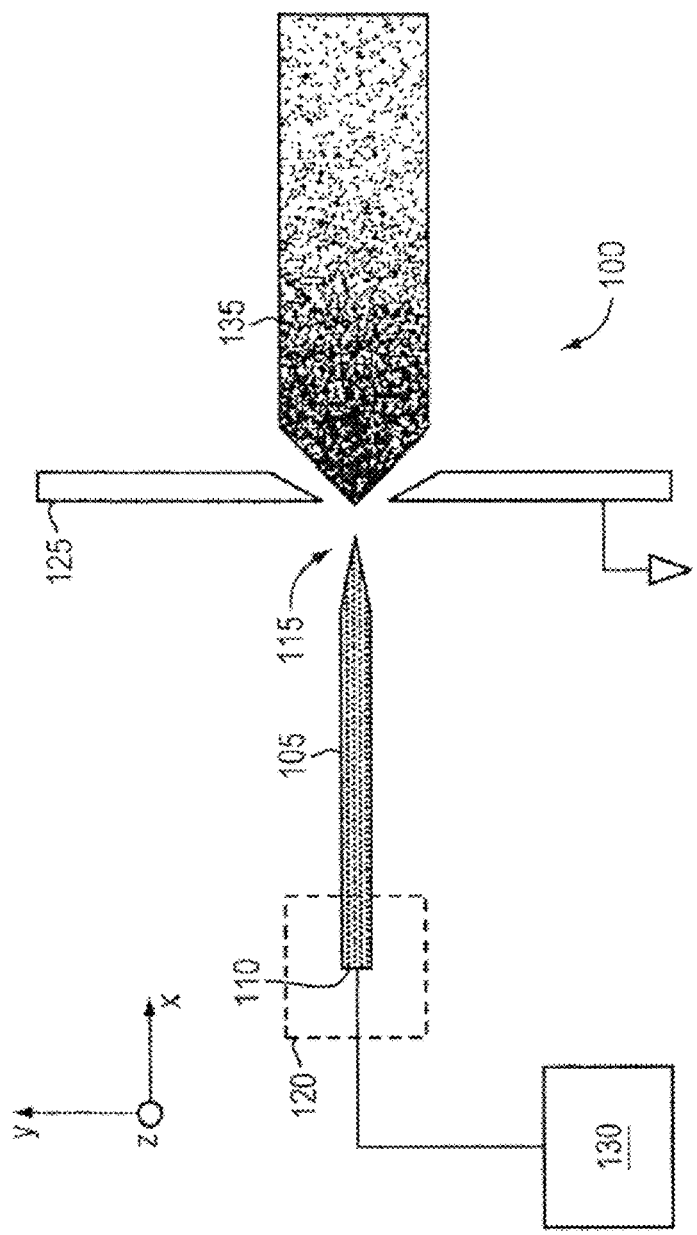
FIG. 2 is a schematic of an ion source, according to an illustrative embodiment of the invention.

FIG. 2 is a schematic of an ion source 100, according to an illustrative embodiment of the invention. The ion source 100 includes a body 105 (e.g., an emitter body) that includes a base 110 and a tip 115. The body 105 can be made of a porous metal (e.g., a microfabricated emitter body formed from a porous metal substrate) compatible with an ionic liquid or a room temperature molten salt (e.g., does not react or result in electrochemical decaying or corrosion). The body 105 can be mounted relative to a source 120 of ionic liquid or a source of a room temperature molten salt. The body 105 includes a pore size gradient that decreases from the base 110 of the body 105 to the tip 115 of the body 105, such that ionic liquid can be transported through capillarity (e.g., through capillary forces) from the base 110 to the tip 115. The ionic liquid can be continuously transported through capillarity from the base 110 to the tip 115 so that the ion source 100 (e.g., emitter) avoids liquid starvation. An electrode 125 can be positioned downstream relative to the body 105. A power source 130 can apply a voltage to the body 105 relative to the electrode 125, thereby emitting a current (e.g., a beam of ions 135) from the tip 115 of the body 105. The application of a voltage can cause formation of a Taylor cone (e.g., as shown in FIG. 1) at the tip 115 and cause the emission of ions 135 from the tip 115.

In some embodiments, the body 105 is an emitter that is a cylindrical needle or a flat ribbon-like needle. Emitter geometry (e.g., shape and/or configuration of the emitter body) can affect the current generated by the emitter. For instance, flat ribbon-like configurations yield more current than traditional cylindrical solid needles. A tungsten externally wetted emitter can generate about 0.2 µA per emitter. In contrast, a flat ribbon tungsten emitter can generate up to about 10 µA per emitter. In some embodiments, a radius of curvature of the tip 115 of the body 105 can be in the range of about 1 µm to about 20 µm in the horizontal direction (e.g., along the z axis) and a radius of curvature of about 2 µm to about 3 µm in the vertical direction (e.g., along the y axis).

The body 105 can be microfabricated from a porous metal substrate. Body 105 can be formed by electrochemical etching. In some embodiments, the body can be formed of a porous metal substrate (e.g., tungsten) but other materials may be present. The body 105 can be microfabricated from a porous metal compatible (e.g., does not react or result in electrochemical decaying or corrosion) with ionic liquids and/or room temperature molten salts. Examples of such porous metals include tungsten, nickel, magnesium, molybdenum, or titanium.

The pore size gradient of the body 105 can allow ionic liquid from the source 120 to be transported from the base 110 to the tip 115. In some embodiments, the size of the pores in the base 110 are larger than the pores in the metal at the tip 115, which allows for the ionic liquid to be transported through capillarity (e.g., capillary forces) from the base 110 of the emitter to the tip 115. By transporting the ionic liquid through capillarity, the pore size gradient can act as a passive, self-regulating capillary supply that reduces mass and complexity over capillary systems (e.g., by substantially reducing the need for a pressurized system). The pore size gradient can continuously provides ionic liquid to the tip 115, reducing the chances that the ion source will suffer from liquid starvation. Flow throughout the body (e.g., increased volume flow from the pores) can allow for even more current than solid ribbon emitters.

FIG. 2 depicts an ion source comprising an emitter body 105, however, a plurality of emitters (e.g., an array of emitters) can be used in a 1D or 2D array. The array of emitters can also be microfabricated from a porous metal (e.g., a unitary porous metal substrate) compatible with the at least one of ionic liquid or room-temperature molten salt. Each emitter, as described above, can have a pore size gradient that decreases from the base of the emitter to the tip of the emitter so that the ionic liquid is transported through capillarity from the base to the tip of each emitter. An electrode (e.g., electrode 125) can be positioned downstream relative to the array of emitters and a power source (e.g., power source 130) can provide a voltage to the array of emitters with respect to the electrode.

Figure 3:
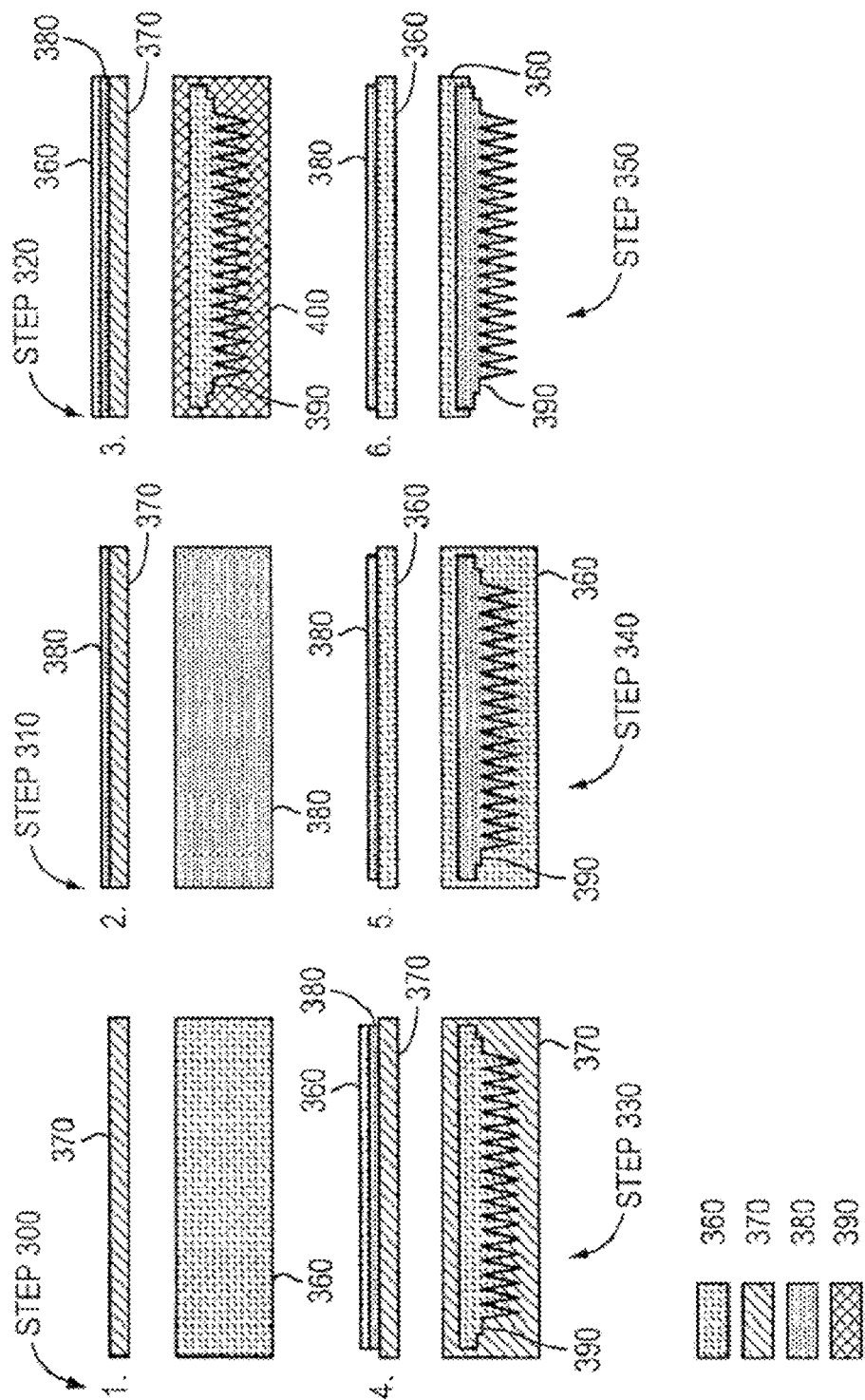
FIG. 3 shows a schematic for a method for manufacturing a porous metal electrospray emitter, according to an illustrative embodiment of the invention.

FIG. 3 shows a schematic for a method for manufacturing a porous metal electrospray emitter, according to an illustrative embodiment of the invention. Single emitters (e.g., emitter body 105 as shown in FIG. 2) or arrays of emitters (e.g., 1D or 2D arrays) can be manufactured from porous metallic substrates using micro fabrication techniques, such as photolithography and electrochemical etching. Porous metal emitter(s) can be microfabricated using electrochemical etching with a polyimide film as a masking layer. A method for manufacturing the emitters can include the following steps: (1) filling a porous substrate with positive photoresist (Step 300), (2) applying a layer of polyimide to the sample (e.g., the porous substrate with the photoresist) (Step 310), (3) applying a layer of positive photoresist on the polyimide and exposing the photoresist to transfer the intended geometry (Step 320), (4) developing the photoresist (e.g., to remove the exposed photoresist) and etching the polyimide (Step 330), (5) removing the photoresist (e.g., leaving only the polyimide mask defined by the intended emitter geometry) (Step 340), and (6) etching the sample to form the emitter/emitter arrays (Step 350). The method can also include processing and/or treating a tip of each emitter to vary a pore size between the base and the tip of the emitter.

A method for manufacturing the emitters can include the step of providing a porous metal substrate 360. The emitter body can be formed from a porous metal compatible (e.g., does not react or result in electrochemical decaying or corrosion) with an ionic liquid or room temperature molten salt. For example, tungsten sheets (e.g., porous tungsten sheets with a 0.25 mm thickness and 2 micron porosity from American Elements, Los Angeles, Calif.) can be cut into 1 cm by 2.5 cm pieces using a diesaw (e.g., Disco Abrasive System Model DAD-2H/6T from DISCO, Tokyo, Japan) and cleaned in acetone followed by isopropanol. Other porous metals compatible with ionic liquids and room temperature molten salts can be used as well. For example, the porous metal can be nickel, magnesium, molybdenum, titanium, or any combination thereof. In some embodiments, a unitary substrate of a porous metal can be used to form more than one emitter (e.g., an emitter geometry pattern that can be used to form an emitter array). The use of porous metal results in the increased capillary flow capacity provided by the volumetric porosity of the emitter substrate. The emitters can be manufactured from one or more substrates to form one or more flat emitters (e.g., needles).

The porous metal substrate can be developed to form a sample that includes porous metal substrate 360 (e.g., porous tungsten substrate) with the pores blocked (Step 300), for example, with a photoresist 370. The porous metal substrate can be filled with photoresist 370 (e.g., Shipley 1827 positive photoresist) and the substrate exposed (e.g., both sides) with UV light to block pores of the porous metal to form the sample. In some embodiments, the substrate can be allowed to soak in the photoresist 370 (e.g., for 20 seconds). The sample (e.g., the porous metal substrate with the photoresist) can be spun for 60 seconds starting at 700 rpm and increased to 1700 rpm with an acceleration of 200 rpm/s. The sample can then be baked by heating on a hotplate for 20 seconds at 70° C. followed by 30 seconds in an oven at 90° and 30 seconds at 130°. In some embodiments, both sides of the sample can be exposed using a broadband aligner (e.g., a Karl Suss MJB3 from Suss-MicroTec, Waterbury Center, Conn.) for 150 seconds and immersed in a developer (e.g., a high pH solution developer such as MF-319 to "wash" away the material to be eliminated upon UV exposure) until both surfaces are cleared of photoresist. A broadband aligner can be used in microfabrication to transfer a pattern to a photoresist-coated substrate by shining UV light. If no pattern is to be applied, the UV light can be used to produce the decay on exposed surfaces. The photoresist 370 can be left substantially filling the bulk of the porous media to prevent polyimide from entering the pores. The samples can be cleaned in deionized (DI) water and dried.

In some embodiments, the surface of the porous metal 360 can be blocked by the uniform deposition of mono-layers of a compatible metal using Chemical Vapor Deposition (CVD) (e.g., thermal evaporation technique involving boiling and depositing a material on to a relatively colder surface, such as, for example, depositing the compatible metal on to the porous substrate). Mono-layers of a compatible metal using CVD can be deposited instead of soaking the porous metal substrate in photoresist polymers. One benefit is that pores can be substantially clear of potential contamination that could hurt the etching process and electrospray operation. A "compatible metal" can be a metal that is compatible with ionic liquids and the porous substrate material (e.g., does not react or result in electrochemical decaying or corrosion). For example, if the porous metal substrate 360 is a porous tungsten substrate, the surface of the porous tungsten substrate can be blocked by the uniform deposition of mono-layers of tungsten using CVD.

The method can also include the step of adding a layer of polyimide 380 (e.g., PI2556 polyimide from HD Microsystems) to a first side of the sample (e.g., the porous metal substrate 360 with the pores blocked with the photoresist 370) (Step 310). The sample can be prebaked to drive off solvents. Polyimide 380 can be used as the masking material for its resistance to Sodium Hydroxide and ability to be precisely patterned using standard photolithography techniques. In some embodiments, a 1.5 µm layer of polyimide 380 is spun onto one surface of the sample. The sample can be prebaked by pooling the polyimide 380 on the surface for 10 seconds, spun at 500 rpm for 5 seconds and slowly ramped up to 1300 rpm and spun for 50 seconds. The polyimide 380 can be heated on a hotplate at 55° for 30 seconds and 70° for 30 seconds followed by oven bakes at 90° for 60 seconds and 130° for 60 seconds. The gradual heating protocol employed can limit the amount of holes in the polyimide 380 caused by gas trapped in the bulk of the porous media escaping during rapid heating.

The method can also include the step of applying photoresist 370 to the first side of the sample (e.g., porous metal substrate with the blocked pores and including a layer of polyimide) (Step 320). A layer of photoresist 370 can be applied on top of the polyimide 380 (e.g., the layer of polyimide 380 applied to the porous metal substrate 360 in Step 310 above). In some embodiments, a layer of photoresist 370 having a thickness of about 5 µm is spun onto the polyimide 380. The sample can be heated at 70° for 30 seconds on a hotplate and 130° for 90 seconds in an oven. A transparency mask (e.g., photolithography transparencies from PageWorks, Cambridge, Mass.) can be applied to the first side of the sample and exposed with a UV light to form the emitter geometry pattern 390 and exposed parts of positive photoresist 400.

The sample can be developed to transfer the emitter geometry pattern 390 to the sample. The sample can be developed to remove the exposed positive photoresist 400 from the sample (Step 330). The exposed parts of the positive photoresist 400 can be removed to etch the underlying polyimide 380 (e.g., to remove the portion of the polyimide 380 covered by exposed parts of the photoresist and leave the portion of the polyimide covered by the unexposed photoresist), thereby transferring the desired emitter geometry pattern 390. In some embodiments, samples are exposed for 120 seconds and developed in MF-319 until the pattern is transferred to the polyimide.

The method can also include the step of cleaning photoresist off the sample (e.g., cleaning off the layer of the unexposed photoresist from Step 320) and then curing the sample (Step 340). Curing the polyimide 380 (e.g., the remaining polyimide defined by the emitter geometry pattern 390) in an oven hardens the polyimide 380 against the electrochemical etch chemistry. The samples can be immersed in acetone for 1 hour in an ultrasonic cleaner to remove the photoresist 370 from the surface and the bulk (e.g., to remove the photoresist 370 that was unexposed from Step 320 and also the photoresist 370 that filled the pores of the porous metal substrate 360 in Step 300). The samples can be baked in an anneal furnace to partially cure the polyimide 380 using the following temperature profile: a slow ramp rate from room temperature to 150° C., hold at 150° for 10 minutes then ramp up to 200° and hold for 10 minutes in nitrogen, then a ramp up to 240° and hold for 1.5 hours in nitrogen followed by a slow cool down period.

The sample can be then electrochemically etched to form the emitter geometry 390 (Step 350). The sample (e.g., a unitary substrate of porous metal that has undergone the Steps 300-340 above) can be etched to remove excess porous metal 360 to form the desired emitter geometry 390 (e.g., one or more emitters where each emitter has a base at the first end of the substrate and a tip at the second end of the substrate). The sample can be etched, for example, in Sodium Hydroxide until the excess porous metal 360 (e.g., excess tungsten or other metal) is removed to shape the emitter(s) according to a desired geometry. The emitter(s) can be microfabricated by etching the sample to remove excess porous metal to form, for example, one or more conical shaped emitters or a one or more flat ribbon-like needles/emitters. The remaining polyimide 380 can be then removed, thereby providing the porous metal emitter array with the desired emitter geometry pattern 390.

A tip of an emitter, or an individual emitter in an emitter array, can be processed and/or treated to vary a pore size between the base of the emitter body to a tip of the emitter body. In some embodiments, the smallest pores (e.g., relative to the other pores in the emitter) are near the emitter tips. The emitter body can be manufactured to have a pore size gradient that decreases from a first end of the body to a second end of the body (e.g., the pore size becomes smaller towards the second end/tip of the body, so that the sizes of the pores at the second end/tip are smaller than the pore size at the first end/base of the body). The pore size gradient allows the ionic liquid to be continuously transported through capillarity from the first end of the body to the second of the body (e.g., from the base of the emitter to the tip of the emitter).

A nano/meso porous layer of a compatible, electrically conductive material (e.g., zinc on porous tungsten) can be applied to the surface substantially near/around the tip of each emitter to vary a pore size (e.g., to form smaller pores at the tip relative to the base). The size of the pores in the layer of the compatible material can be substantially smaller than the size of the pores in the porous substrate (e.g., the porous emitter). A "compatible metal" can be a metal that is compatible with ionic liquids and the porous substrate material (e.g., does not react or result in electrochemical decaying or corrosion). A compatible metal (e.g., zinc for porous tungsten) can be deposited through thermal evaporation. The compatible metal (e.g., zinc) can form aggregates over the porous metal emitter (e.g., porous tungsten). In some embodiments, a layer about 1-5 microns thick of compatible metal can be deposited. Carbon nanotubes can also be attached to the surface of the emitter substantially near/around tip of each emitter to form the pore size gradient (e.g., to form smaller pores at the tip relative to the base). Carbon nanotubes can be deposited on the surface (e.g., at or substantially near the tip of the emitter) forming a relatively well-organized porous "forest." In both cases, the introduction of dissimilar porosities for preferential flow (e.g., pore sizes smaller at the tip than the base of the porous metal emitter) facilitates liquid transport to the emission sites (e.g., the tip of the emitter).

Traditional ion sources using normal solvents (with non-zero vapor pressures) do not, in principle, use controlled pore variation since the liquid/vapor interface is in equilibrium (e.g., water with water vapor) and is convected outwards through evaporation, including inside the pores. Porous metal electrospray emitters, however, have no preferential direction for convection since there is no thermal evaporation from ionic liquids. There is only ion evaporation, but for it to occur, the liquid is transported to the tips through capillarity (e.g., capillary forces).

Figure 4:
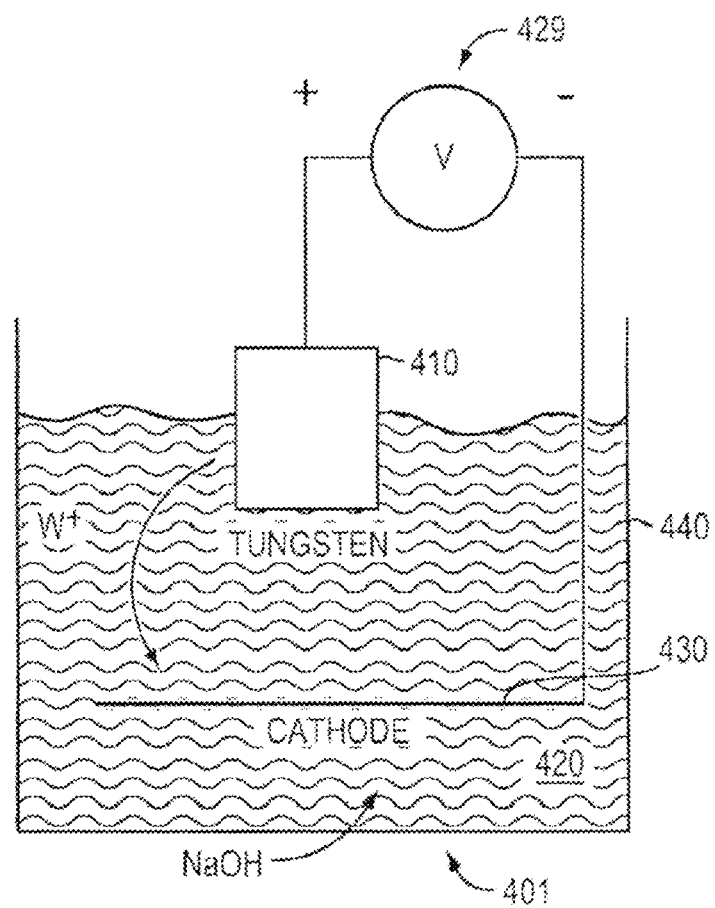
FIG. 4 shows a schematic of a setup for electrochemical etching, according to an illustrative embodiment of the invention.

FIG. 4 shows a schematic of a setup 401 for electrochemical etching, according to an illustrative embodiment of the invention. As noted above, emitters can be manufactured from electrochemically etched porous metal substrates (e.g., porous tungsten) with a polyimide layer acting as an etch mask. Isotropic etching (e.g., step 350 in FIG. 3) can be performed to form emitter geometry. The masked sample 410 (e.g., the sample from Step 340) can be placed into a container filled with an etchant solution 420 (e.g., 1N sodium hydroxide (NaOH)). An electric potential (e.g., DC electric potential) can be applied using a power source 429 between the sample 410 and a cathode 430 (e.g., a stainless steel cathode) to initiate the etching process. The etching can be performed, for example, in a glass beaker 440 with a circular cathode surrounding the piece. To aid in the formation of even tips and to enhance the etching rate, the porous metal sample 410 can be removed periodically and immersed in an ultrasonic cleaner to clear the surface of the residue and to remove bubbles that form on the surface. The etching can also be carried out in a uniform flow of etchant, which can reduce the effect of eddies and bubble formation on the etch. Following the completion of the etch, sodium hydroxide can be rinsed off the sample in DI water. The remaining polyimide mask (e.g., the remaining polyimide mask defining the emitter geometry as described in Steps 340 and 350 in FIG. 3 above) can be removed in Piranha (e.g., 4:1 mixture of sulfuric acid and hydrogen peroxide). Following a rinse in DI water, the emitters can be blown dry with nitrogen.

Figure 5:
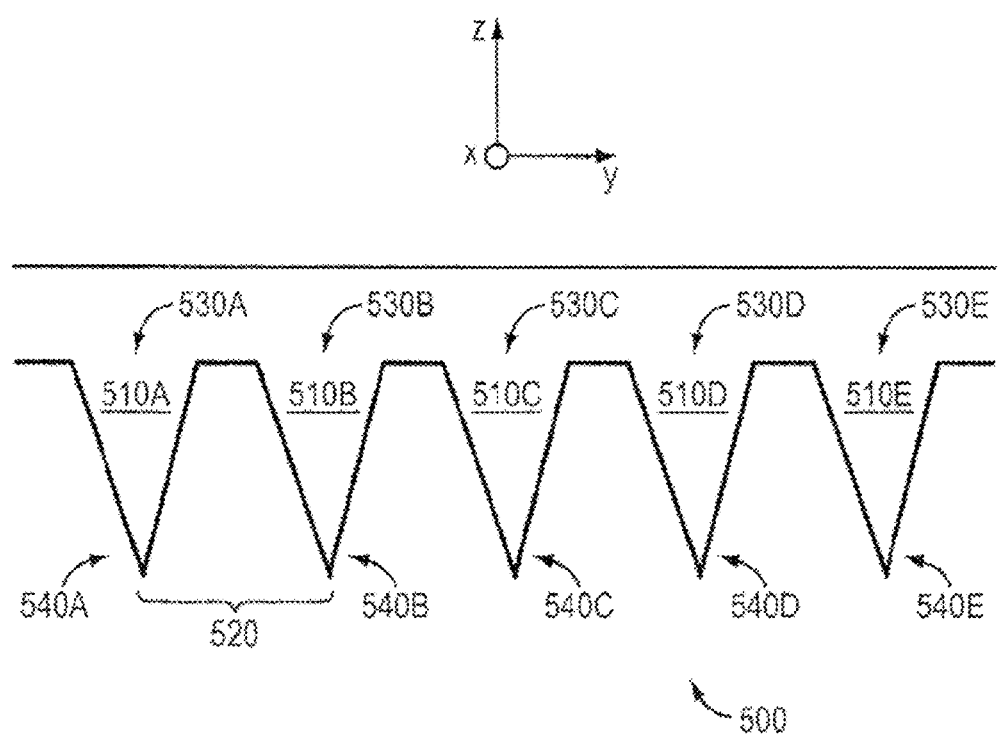
FIG. 5 shows a schematic of a porous metal electrospray emitter array, according to an illustrative embodiment of the invention.

FIG. 5 shows a schematic of a porous metal electrospray emitter array 500, according to an illustrative embodiment of the invention. The emitters 510A-510E can be manufactured to have emitter spacing 520 of less than about 1 mm. Each emitter can have a pore size gradient that decreases from the base 530A-530E of the emitter to the tip 540A-540E of the emitter 510A-510E. The ionic liquid can be continuously transported through capillarity (e.g., capillary forces) from the base 530A-530E to the tip 540A-540E of each emitter 510A-510E. In some embodiments, any one of emitter(s) 510A-510E can have a radius of curvature of about 10 µm to about 20 µm in the horizontal direction (e.g., along the y-axis) and a radius of curvature of about 2 µm to about 3 µm in the vertical direction (e.g., along the x-axis). The emitter array 500 can include a plurality of emitters 510A-510E microfabricated from a porous metal. The porous metal can be compatible (e.g., does not react or result in electrochemical decaying or corrosion) with an ionic liquid or room-temperature molten salt. The emitters can be formed by electrochemical etching. In some embodiments, the porous metal is tungsten, nickel, magnesium, molybdenum, titanium, or any combination thereof.

Figure 6:
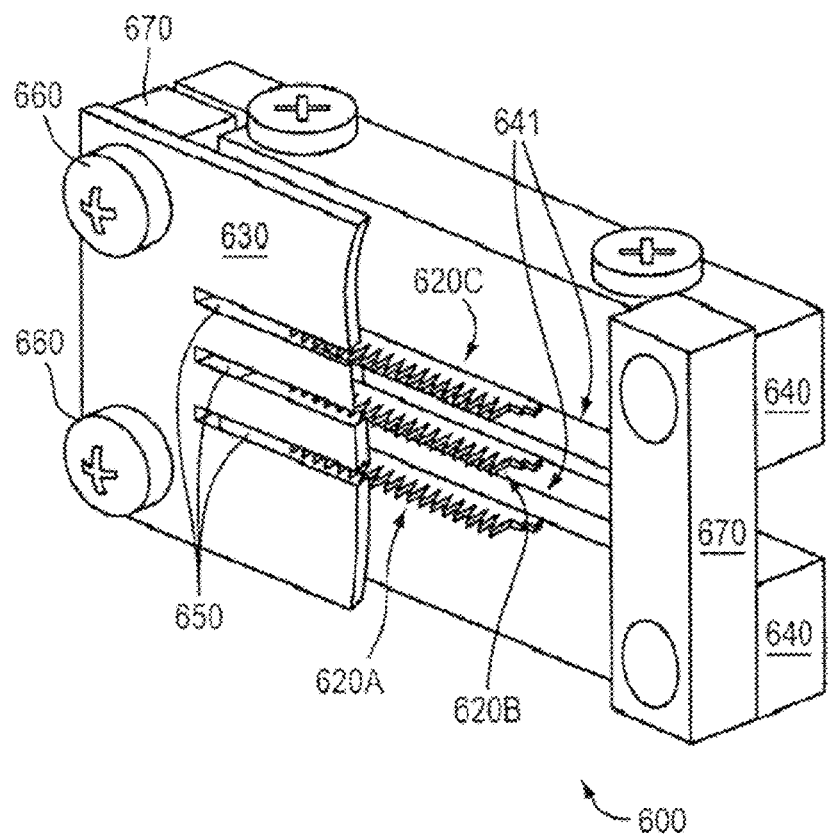
FIG. 6 is a drawing of a porous electrospray emitter array assembly, according to an illustrative embodiment of the invention.

FIG. 6 is a drawing of a porous metal electrospray emitter array assembly 600, according to another illustrative embodiment of the invention. A plurality of emitters (e.g., two or more emitters) can be grouped together to form a thruster. The typical thrust of a single emitter/needle operating in the ionic mode is on the order of about 0.05 µN/µA to about 0.1 µN/µA, therefore emitters can be grouped to produce as much current as possible (e.g., for different space applications). A thruster assembly can include emitter sheets 620A-620C (e.g., where each sheet includes one or more one emitters) together to create a 2D array of emitters. The emitters can be placed relative to an extractor 630, resulting in the generation of an ionic beam.

In this embodiment, the ion source 600 is a thruster that includes a set of 3 flat needle arrays 620A-620C, each containing up to 18 individual emitters giving a maximum of 54 emitters with a tip to tip separation of about 1 mm. The thruster 600 provided an emitter density of a little under 0.5 tips per mm². In this embodiment, individual emitter sheets 620A-620C are clamped in place between two bars 640 (50×7.9×7.9 mm stainless steel). Emitter sheet separation can be provided by plates 641 (e.g., 1.5 mm inch thick stainless steel plates 165 cut by a waterjet).

Extractor 630 can be made from stainless steel (e.g., a 0.635 mm thick stainless steel sheet). In this embodiment, the individual extractor slits 650 are 1 mm wide which gives clearance for a beam spreading half angle of 51 degrees when the emitter tips are just touching the extractor slit plane. The extractor 630 can be attached to the holder bars 670 using fastening mechanism 660 and 670 (e.g., two polycarbonate #6-32 screws with two polyethylene spacers). The combination of screws 660 (e.g., or other similar fastening device) and spacers 670 can provide electrical insulation between the extractor 630 and emitters 620A-620C and can inhibit the liquid fuel from migrating to the extractor and causing a short.

The thruster assembly 600 can provide precise alignment between the emitter sheets 620A-620C and the extractor grid 630 to reduce beam impingement. The thruster assembly 600 can provide adequate insulation (e.g., electrical and fluidic insulation) between the extractor 630 and emitters 620A-620C to reduce the risk of electrical shorting. The assembly 600 includes materials that are compatible (e.g., does not react or result in electrochemical decaying or corrosion) with ionic liquids for long periods of time. The thruster assembly 600 is easy to assemble, to reduce the risk of breaking emitters.

Figure 7A:
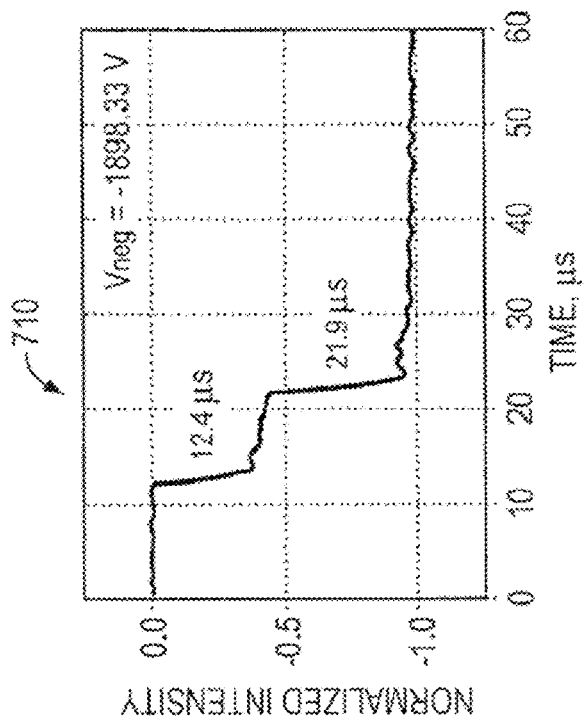
FIG. 7A is a graph showing time of flight measurements for a porous metal electrospray emitter array, according to an illustrative embodiment of the invention.
Figure 7B:
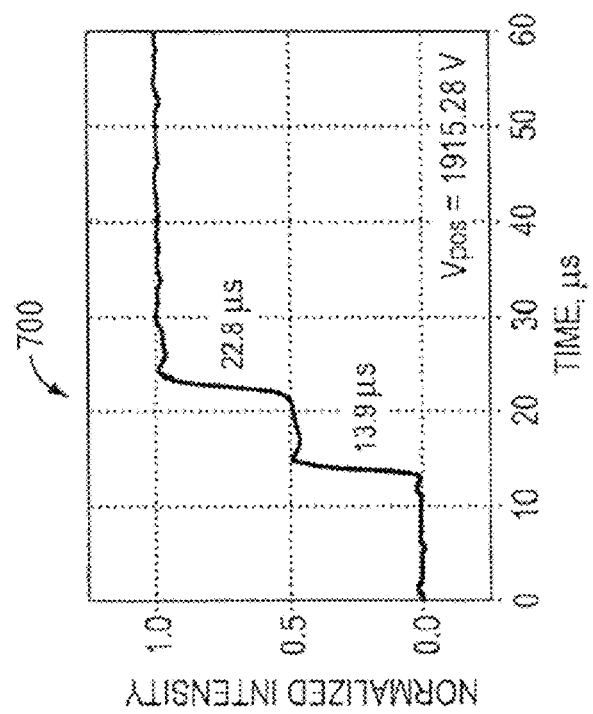
FIG. 7B is another graph showing time of flight measurements for a porous metal electrospray emitter array, according to an illustrative embodiment of the invention.

FIGS. 7A-7B show graphs 700 and 710 show time of flight measurements for a porous metal electrospray emitter array. Plots 700 and 710 show the normalized intensity of a beam of ions generated by a porous metal Electrospray emitter array, as a function of time. The emitters tested used EMI-BF4 (3-ethyl-1-methylimidazolium tetrafluoroborate) as the Ionic Liquid. EMI-IM (1-ethyl-3-methylimidazolium bis(trifluoromethylsulfonyl)imide) can also be used as the ionic liquid. The time-of-flight technique was used to determine the composition of the emitted beam on a single flat needle array containing 6 emitters. The time of flight curves for positive (1915.28 V) and negative (−1898.33 V) emission are shown in Graphs 700 and 710, respectively. Time-of-flight mass spectrometry shows that the emitted beam is purely ionic and includes two species of ions in both positive and negative modes of operation. The contribution of each ion species to the total current can be calculated by looking at the relative changes in measured current during the time-of-flight tests. The lack of an elongated tail following the steps indicates that there are no droplets contributing to the emitted current. Operating an electrospray source in a mixed droplet-ion regime could be very costly in terms of efficiency and specific impulse.

In FIGS. 7A-7B, the time it takes for particles to travel a known distance was measured and then a charge to mass ratio was calculated based on the velocity. From the drift time measured for the particles to travel between the given distance between the electrostatic gate and the detector (L=751.57 mm) the specific charge ratio and subsequently the mass of the species can be calculated using EQN 1.

$$\left(\frac{q}{m}\right)_1 = \frac{(L/t_1)^2}{2\phi_B}  \quad \text{EQN. 1}$$

where "L" is the drift distance in the time-of-flight spectrometer, "m" is the particle mass, "q" is the particle electric charge, "$t_1$" is the time of flight over drift distance, and "ΦB" is the on-axis accelerating potential. As an approximation, the on-axis accelerating potential can be taken to be equal to the extraction potential. In reality, it can be up to 7 eV lower. The results are tabulated in table 1.

TABLE 1

Emitted Beam Composition

| Polarity | Time of Flight (µs) | Mass (amu) | % of Total Current | $\left(\frac{q}{m}\right)$ C/gr | Correponding Ion |
|---|---|---|---|---|---|
| Positive | 13.9 | 112.40 | 42.58 | 430.6 | [EMI]$^+$ |
| (1915.28 V) | 22.8 | 310.15 | 57.42 | | [EMI-BF$_4$][EMI]$^+$ |
| Negative | 12.4 | 89.49 | 49.13 | 513.9 | [BF$^-$] |
| (−1898.33) | 21.9 | 287.28 | 50.87 | | [EMI-BF$_4$][BF$^-$] |

Figure 8B:
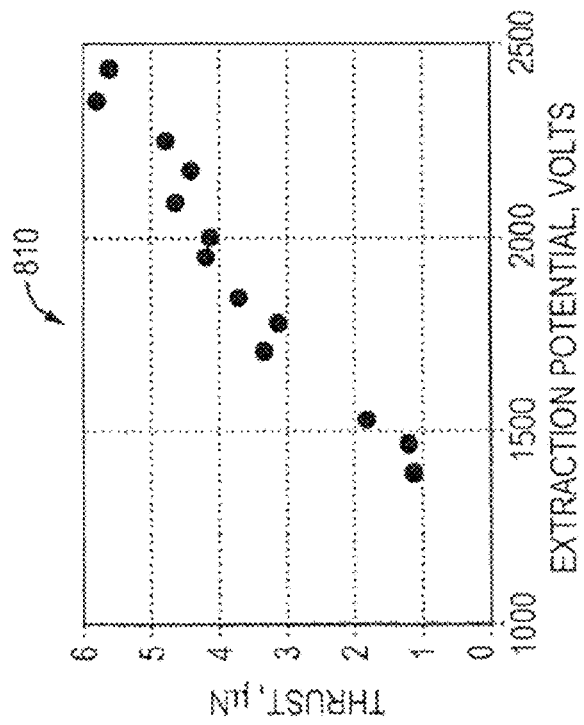
FIG. 8B is another graph showing thrust measurements for a porous metal electrospray emitter array, according to an illustrative embodiment of the invention.
Figure 8A:
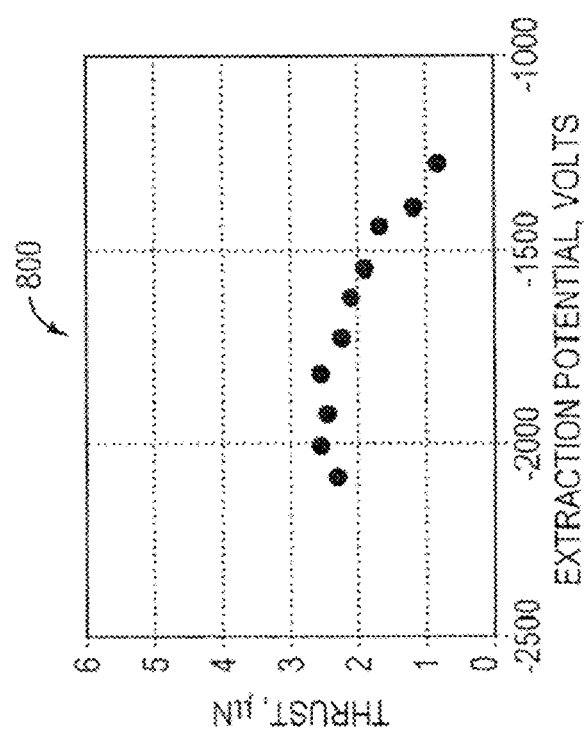
FIG. 8A is a graph showing thrust measurements for a porous metal electrospray emitter array, according to an illustrative embodiment of the invention.

FIGS. 8A-8B are graphs 800 and 810 showing thrust measurements for the porous metal electrospray emitter array containing 6 emitters from FIGS. 7A-7B. Graphs 800 and 810 show the measured thrust as a function of extraction potential for a negative extraction voltage range and a positive extraction voltage range, respectively. Thrust measurements were conducted at the Busek Company, Natick, Mass. using a torsional balance capable of measuring sub micro newton forces. Porous metal electrospray emitters have been shown to support an increase in current of over an order of magnitude as compared to solid cylindrical emitters. The results show that the thruster produced from about 0.82 µN to about 2.33 µN in the −1282 V to −2088 V negative extraction voltage range 800 and from about 1.08 µN to about 5.67 µN in the 1391 V to 2437 V positive extraction voltage range 810. This corresponds to a thrust per emitter tip of about 0.048 µN at −2088 V and about 0.116 µN at 2437 V. The leveling off of thrust in the negative mode can be due to the thruster approaching the limit of its ability to transport liquid to the tip.

Figure 9B:
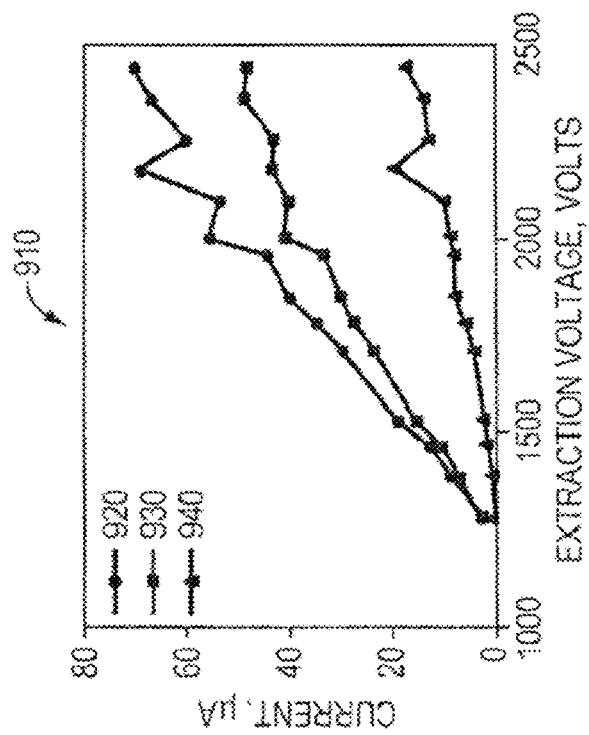
FIG. 9B is another graph showing current and voltage measurements for a porous metal electrospray emitter array, according to an illustrative embodiment of the invention.
Figure 9A:
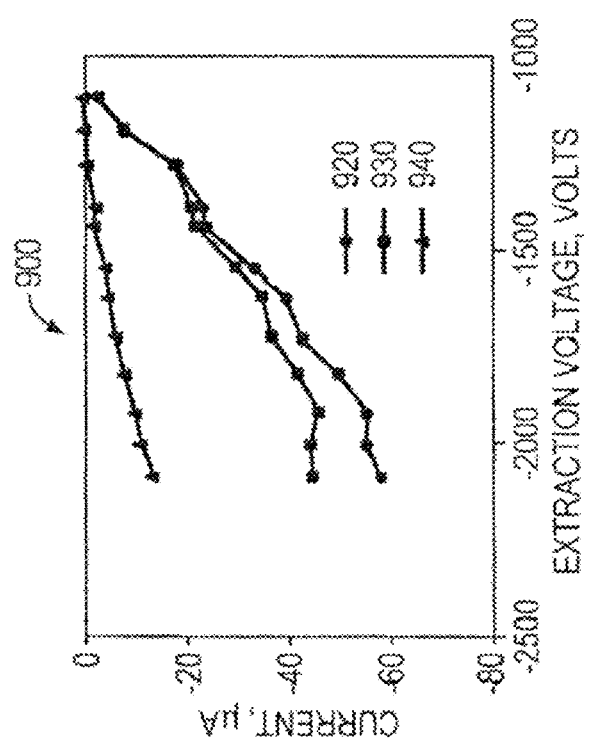
FIG. 9A is a graph showing current and voltage measurements for a porous metal electrospray emitter array, according to an illustrative embodiment of the invention.
Figures 10A, 10B:
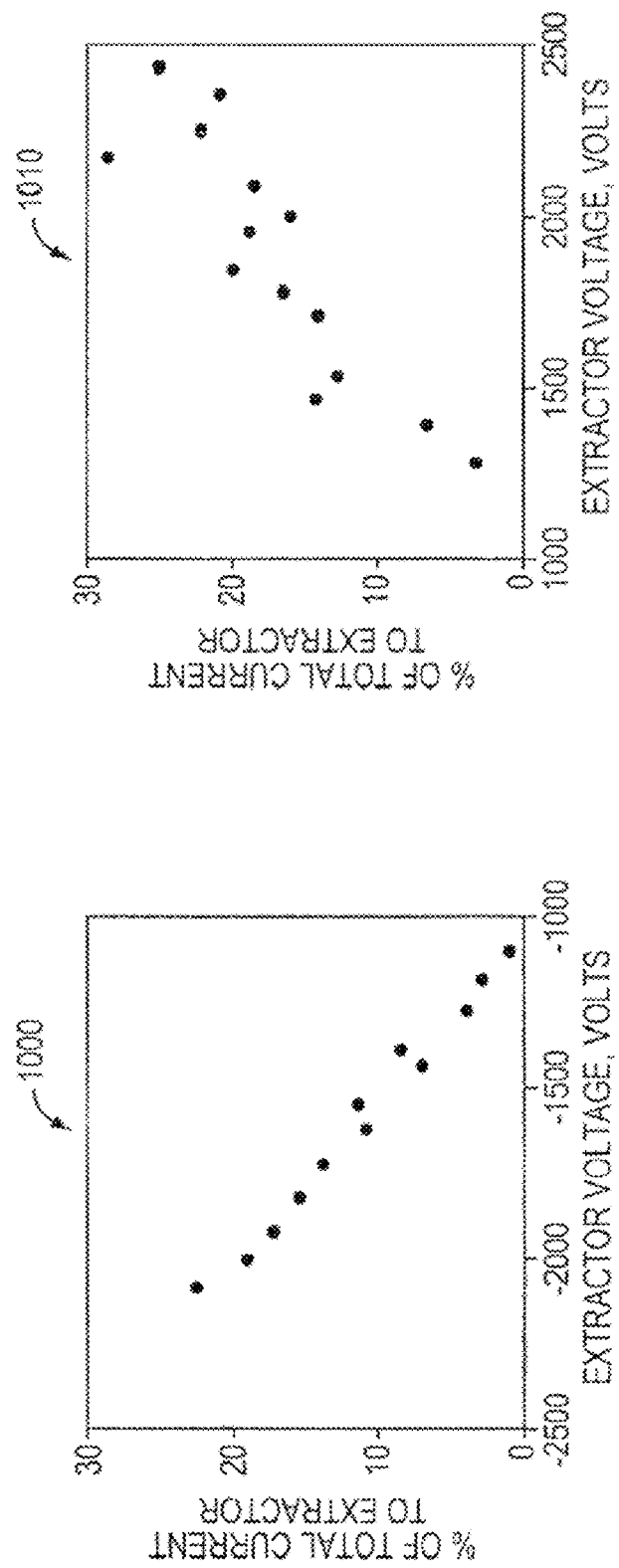
FIG. 10A is a graph showing the percentage of current for a porous metal electrospray emitter array, according to an illustrative embodiment of the invention.
FIG. 10B is another graph showing the percentage of current for a porous metal electrospray emitter array, according to an illustrative embodiment of the invention.

FIGS. 9A-9B show current as a function of extraction voltage measurements for the porous metal electrospray emitter array containing 6 emitters from FIGS. 7A-7B. Graphs 900 and 910 show the measured current in a beam of ions generated by the porous metal Electrospray emitter array as a function of extraction voltage for a negative extraction voltage range and a positive extraction voltage range, respectively. Plot 940 is the current measured/lost in the extractor (e.g., electrode), plot 930 is the current measured in the beam of ions and plot 920 is the total current collected. FIGS. 10A-10B show the percentage of current for the same emitter array. Graphs 1000 and 1010 show the percentage of total current lost to the extractor as a function of extractor voltage for a negative extraction voltage range and a positive extraction voltage range, respectively. A small fraction of the beam current (about 10%-20%) was lost to the extractor which is due to beam impingement. The extractor geometry can be changed aligned to minimize the current lost to the extractor. Extractors can be, for example, positioned a distance about 1 emitter height away from the tip and can be aligned through the fabrication of alignment features on the substrates. The extractor thickness can also be reduced to minimize current lost to the extractor.

The beam current can be extracted using the following equation:

$$\frac{F}{I_B} = \sqrt{\frac{2\phi_B}{(q/m)}} \quad \text{EQN. 2}$$

where F is the measured thrust and $I_B$ is the Electrospray beam current. The specific charge ratio can be calculated as described above in EQN. 1 for the time of flight measurements. In addition, there can exist some beam current unaccounted for in the extractor current and collected current, due to the effect of secondary electrons caused by the high energy ions hitting the extractor and the collector. The collector can be biased to trap the secondaries and reduce this effect.

Figure 11A:
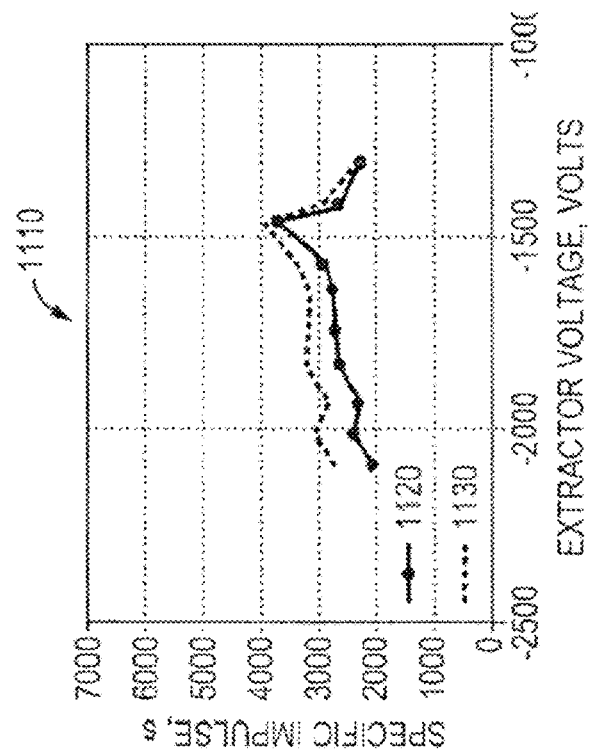
FIG. 11A is a graph showing the specific impulse for a porous metal electrospray emitter array, according to an illustrative embodiment of the invention.
Figure 11B:
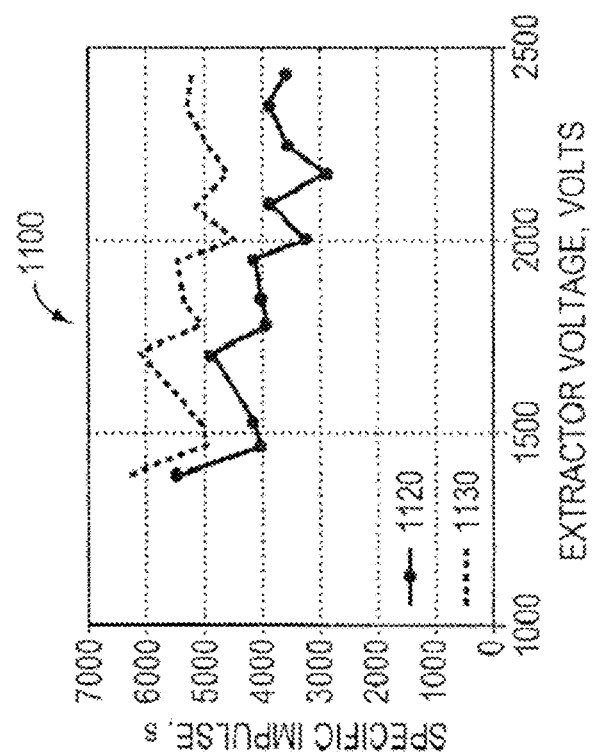
FIG. 11B is another graph showing the specific impulse for a porous metal electrospray emitter array, according to an illustrative embodiment of the invention.

FIGS. 11A-11B show the specific impulse for the porous metal electrospray emitter array containing 6 emitters from FIGS. 7A-7B. Graphs 1100 and 1110 show the specific impulse measured as a function of extraction voltage for a positive extraction voltage range and a negative extraction voltage range, respectively. Plot 1120 charts the measured specific impulse and plot 1130 charts the maximum specific impulse. In the negative polarity regime 1110, the emitters produced up to about −57.17 µA in current and a thrust of up to about 2.33 µN, yielding a specific impulse (ISP) of about ISP of about 2000 to 3000 seconds. In the positive polarity regime 1100, the emitters produced up to about 69.84 µA in current and a thrust of up to about 5.67 µN, yielding an ISP of about 3000 to 5000 seconds.

In some embodiments of the invention, emitters and/or emitter arrays can be fabricated from a dielectric material (e.g., a ceramic, glass, or other oxide material). In some embodiments, emitters and/or emitter arrays can be fabricated from a metal material (e.g., silver, stainless steel, tungsten, nickel, magnesium, molybdenum, titanium, any combination thereof, or any of these metals coated with a noble metal material such as platinum or gold). Some embodiments of the invention include a distal electrode, as described in greater detail below. In some embodiments, the distal electrode can be made from a metal material (e.g., silver, stainless steel, tungsten, nickel, magnesium, molybdenum, titanium, any combination thereof, or any of these metals coated with a noble metal material such as platinum or gold).

FIG. 12 is a schematic of an ion source 1200, according to an illustrative embodiment of the invention. The ion source 1200 includes a body 1205 (e.g., an emitter body) that includes a base 1210 and a tip 1215. The body 1205 can be made of a porous material (e.g., a microfabricated emitter body formed from a porous material substrate) compatible with an ionic liquid or a room temperature molten salt. The body 1205 can be externally wetted by an ionic liquid or a room temperature molten salt (e.g., ionic liquid 1220). The body 1205 includes a pore size gradient that decreases from the base 1210 of the body 1205 to the tip 1215 of the body 1205, such that ionic liquid 1220 can be transported through capillarity (e.g., through capillary forces) from the base 1210 to the tip 1215. For example, ionic liquid 1220 can be continuously transported through capillarity to the tip 1215 so that the ion source 1200 (e.g., emitter) avoids liquid starvation. An extractor electrode 1225 can be positioned downstream relative to the body 1205. A power source 1230 can apply a voltage to ionic liquid 1220 relative to the extractor electrode 1225, thereby emitting a current from the tip 1215 of the body 1205. The application of a voltage can cause formation of a Taylor cone (e.g., as shown in FIG. 1) at the tip 1215 and cause the emission of ions from the tip 1215. In the illustrated embodiment, the ionic liquid 1220 can be the distal electrode.

In some embodiments, the body 1205 is an emitter that is a cylindrical needle or a flat ribbon-like needle. As noted above, emitter geometry (e.g., shape and/or configuration of the emitter body) can affect the current generated by the emitter. For instance, flat ribbon-like configurations yield more current than traditional cylindrical solid needles. The body 1205 can be microfabricated from a porous material. In some embodiments, the body 1205 can be formed of a porous metal substrate but other materials may be present. The body 1205 can be microfabricated from a porous metal compatible with ionic liquids and/or room temperature molten salts. Examples of such porous metals include silver, stainless steel, tungsten, nickel, magnesium, molybdenum, titanium, any combination thereof, or any of these metals coated with a noble metal material such as platinum or gold.

The body 1205 can be microfabricated from a porous ceramic, porous glass, or other porous oxide material compatible with ionic liquids and/or room temperature molten salts.

The pore size gradient of the body 1205 can allow ionic liquid 1220 to be transported to the tip 115. In some embodiments, the size of the pores in the base 1210 are larger than the pores in the tip 1215, which allows for the ionic liquid to be transported through capillarity (e.g., capillary forces) from the base 1210 of the emitter to the tip 1215. By transporting the ionic liquid through capillarity, the pore size gradient can act as a passive, self-regulating capillary supply that reduces mass and complexity over capillary systems (e.g., by substantially reducing the need for a pressurized system). The pore size gradient can continuously provides ionic liquid to the tip 1215, reducing the chances that the ion source 1200 will suffer from liquid starvation. Flow throughout the body (e.g., increased volume flow from the pores) can allow for even more current than solid emitters.

In some embodiments, the body can be made from a porous dielectric material. Beneficially, electric forces, in addition to the capillarity described above, can facilitate directing the ionic liquid to the body's tip because the dielectric material does not shield the ionic liquid as a body made from metal. In some embodiments, the body can be made from a porous dielectric material without a pore size gradient, where electric forces can facilitate directing the ionic liquid to the body's tip.

Figure 13A:
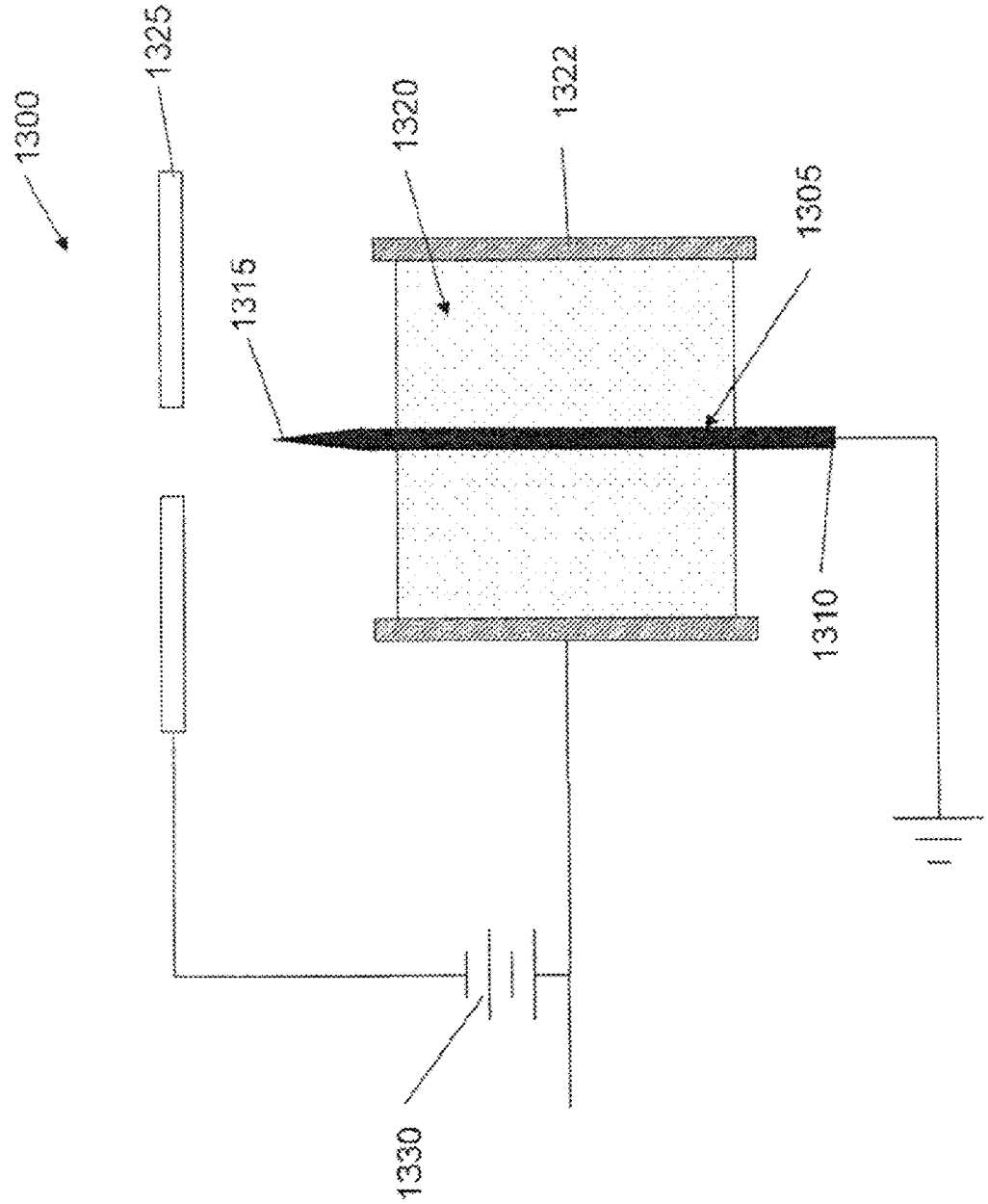

FIGS. 13A and 13B are schematics of an ion source 1300, according to an illustrative embodiment of the invention. FIG. 13A depicts a side cross section of the ion source 1300. FIG. 13B depicts a top view of the ion source 1300. The ion source 1300 includes a body 1305 (e.g., an emitter body) that includes a base 1310 and a tip 1315. The body 1305 can be made of a porous material (e.g., a microfabricated emitter body formed from a porous material substrate) compatible with an ionic liquid or a room temperature molten salt. The body 1305 is disposed in ionic liquid 1320. Ionic liquid 1320 is surrounded by distal electrode 1322. The body 1305 includes a pore size gradient that decreases from the base 1310 of the body 1305 to the tip 1315 of the body 1305, such that ionic liquid 1320 can be transported through capillarity (e.g., through capillary forces) to the tip 1315. For example, ionic liquid 1320 can be continuously transported through capillarity to the tip 1315 so that the ion source 1300 (e.g., emitter) avoids liquid starvation. An extractor electrode 1325 can be positioned downstream relative to the body 1305. A power source 1330 in electrical connection with distal electrode 1322 can apply a voltage to ionic liquid 1320 relative to the extractor electrode 1325, thereby emitting a current from the tip 1315 of the body 1305. The application of a voltage can cause formation of a Taylor cone (e.g., as shown in FIG. 1) at the tip 1315 and cause the emission of ions from the tip 1315.

In some embodiments, the body 1305 is an emitter that is a cylindrical needle or a flat ribbon-like needle. As noted above, emitter geometry (e.g., shape and/or configuration of the emitter body) can affect the current generated by the emitter. The body 1305 can be microfabricated from a porous material. In some embodiments, the body 1305 can be formed of a porous metal substrate (e.g., tungsten) but other materials may be present. The body 1305 can be microfabricated from a porous metal compatible with ionic liquids and/or room temperature molten salts. Examples of such porous metals include silver, stainless steel, tungsten, nickel, magnesium, molybdenum, titanium, any combination thereof, or any of these metals coated with a noble metal material such as platinum or gold. The body 1205 can be microfabricated from a porous ceramic, porous glass, or other porous oxide material compatible with ionic liquids and/or room temperature molten salts.

Figure 14:
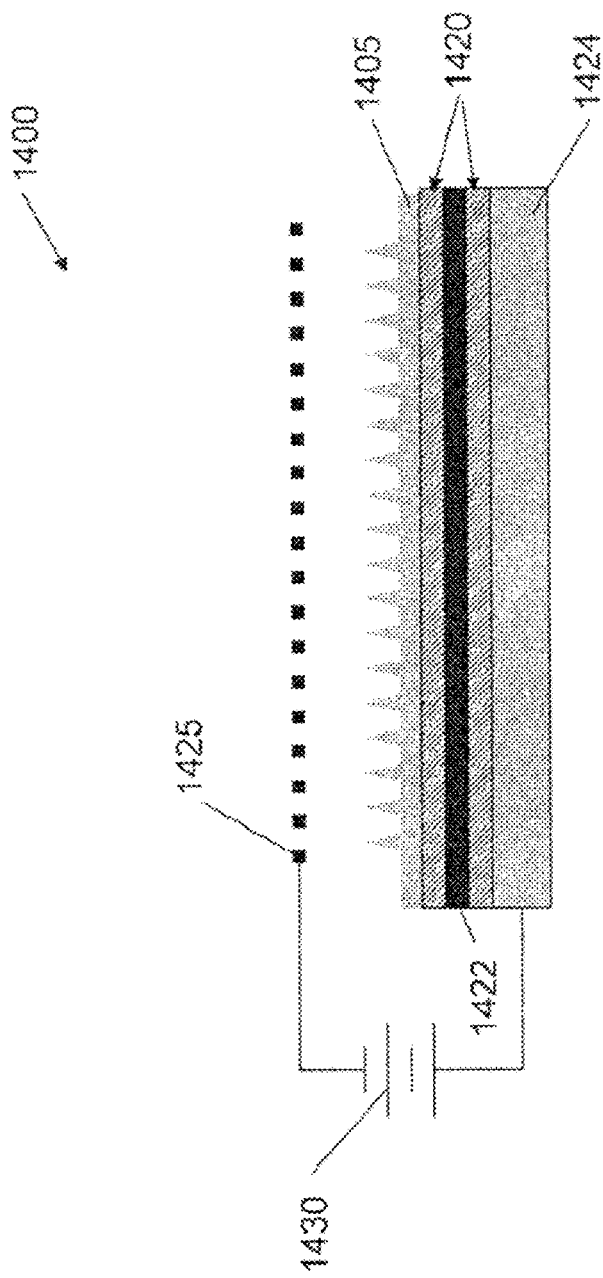
FIG. 14 is a schematic of an electrospray emitter array, according to an illustrative embodiment of the invention.

FIG. 14 is a schematic of an electrospray emitter array 1400, according to an illustrative embodiment of the invention. In this embodiment, the ion source 1400 includes needle emitter array 1405. The needle emitter array 1405 can be made of a porous material (e.g., a microfabricated emitter body formed from a porous material substrate) compatible with an ionic liquid or a room temperature molten salt. The needle emitter array 1405 is disposed on ionic liquid 1420. Ionic liquid 1420 surrounds insulator 1422 and is in contact with distal electrode 1424. As described above, the needle emitter array 1405 includes a pore size gradient that decreases from the base to the tips of the needle emitter array 1405, such that ionic liquid 1420 can be transported through capillarity (e.g., through capillary forces) to the tips. An extractor electrode 1425 can be positioned downstream relative to needle emitter array 1405. A power source 1430 in electrical connection with distal electrode 1424 can apply a voltage to ionic liquid 1420 relative to the extractor electrode 1425, thereby emitting a current from the tips of the needle emitter array 1405.

The needle emitter array 1405 can be microfabricated from a porous material. In some embodiments, the needle emitter array 1405 can be formed of a porous metal substrate (e.g., tungsten) but other materials may be present. The needle emitter array 1405 can be microfabricated from a porous metal compatible with ionic liquids and/or room temperature molten salts. Examples of such porous metals include silver, stainless steel, tungsten, nickel, magnesium, molybdenum, titanium, any combination thereof, or any of these metals coated with a noble metal material such as platinum or gold. The needle emitter array 1405 can be microfabricated from a porous ceramic, porous glass, or other porous oxide material compatible with ionic liquids and/or room temperature molten salts.

Figure 15:
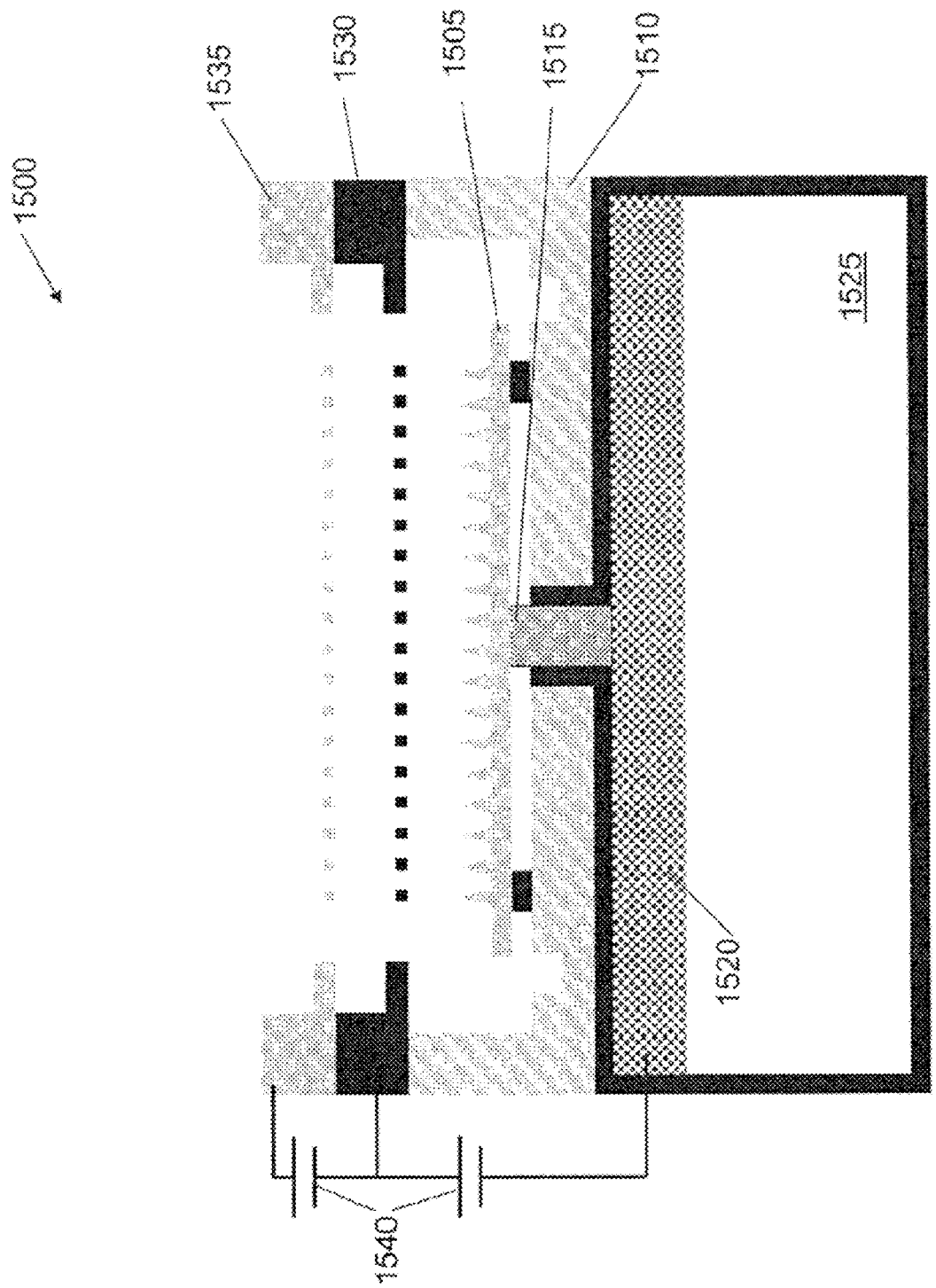
FIG. 15 is a schematic of an electrospray emitter array, according to an illustrative embodiment of the invention.

FIG. 15 is a schematic of an electrospray emitter array 1500, according to an illustrative embodiment of the invention. The ion source 1500 includes emitter array 1505. The emitter array 1505 is housed in a thruster package 1510 (made from e.g., silicon). The emitter array 1505 is disposed against a porous plug/isolation valve 1515. The porous plug/isolation valve 1515 is disposed against a distal electrode 1520. The porous plug/isolation valve 1515 can serve as a connecting member between the emitter array 1505 and the distal electrode 1520. The distal electrode 1520 is in contact with ionic liquid 1525. In some embodiments, each of the emitter array 1505, the porous plug/isolation valve 1515, and distal electrode 1520 can include a pore size gradient that decreases from its base to its top (e.g., in the direction toward the tips of needle emitter array 1505), such that ionic liquid can be transported through capillarity. In some embodiments, the emitter array 1505 can have smaller-sized pores than the porous plug/isolation valve 1515, which in turn can have smaller-sized pores than the distal electrode 1520, creating a pore size gradient that decreases from the distal electrode 1520 to the emitter array 1505, such that ionic liquid 1525 can be transported through capillarity from the distal electrode 1520 to the emitter array 1505.

An extractor electrode 1530 can be positioned downstream relative to the emitter array 1505. An accelerator grid 1535 can be position downstream relative to the extractor grid 1530. A bipolar power source 1545 can apply a voltage to the distal electrode 1520 relative to the extractor electrode 1530, thereby emitting a current (e.g., a beam of ions) from the tips of emitter array 1505. The application of a voltage can cause formation of a Taylor cone (e.g., as shown in FIG. 1) at the tips 115 and cause the emission of ions from the emitter array 1505.

In some embodiments, the emitter array 1505 can be fabricated from a dielectric material (e.g., a ceramic, glass, or other oxide material). In some embodiments, the emitter array 1505 can be fabricated from a metal material (e.g., silver, stainless steel, tungsten, nickel, magnesium, molybdenum, titanium, any combination thereof, or any of these metals coated with a noble metal material such as platinum or gold). In some embodiments, the distal electrode 1520 can be made from a metal material (e.g., silver, stainless steel, tungsten, nickel, magnesium, molybdenum, titanium, any combination thereof, or any of these metals coated with a noble metal material such as platinum or gold). In some embodiments, the extractor electrode 1530 can be fabricated from silicon or tungsten. In some embodiments, the porous plug/isolation valve 1515 can be fabricated from a dielectric material. In some embodiments, the porous plug/isolation valve 1515 can serve as a plug or valve to prevent ionic liquid 1525 from absorbing water and/or other gases from the environment. For example, the electrospray emitter array 1500 can be used as a thruster. The porous plug/isolation valve 1515 can be opened once the thruster is in space to prevent contamination of the ionic liquid.

Figure 16:
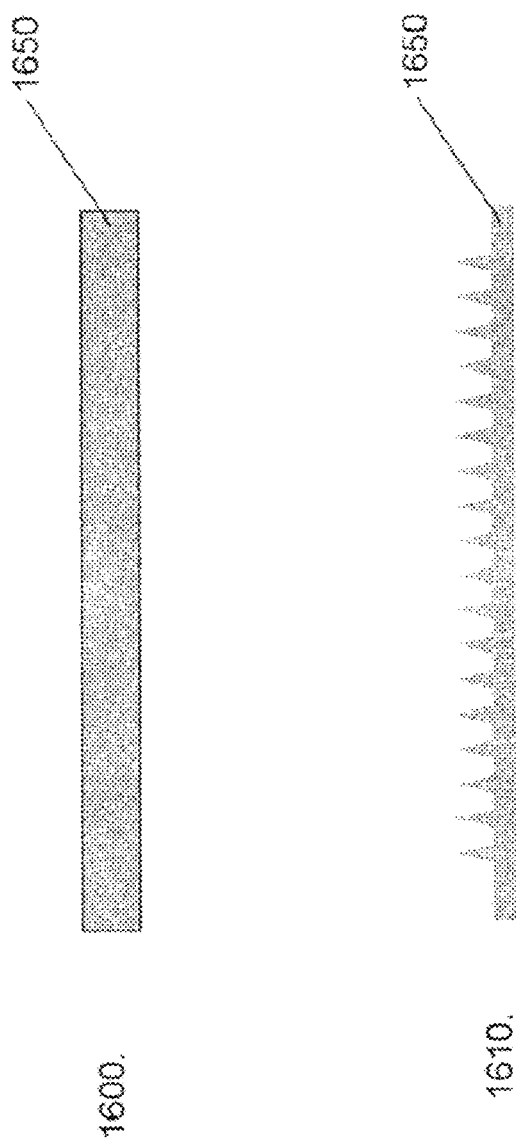
FIG. 16 shows a schematic for a method for manufacturing an electrospray emitter, according to an illustrative embodiment of the invention.

FIG. 16 shows a schematic for a method for manufacturing an electrospray emitter, according to an illustrative embodiment of the invention. Single emitters or arrays of emitters (e.g., 1D or 2D arrays) can be manufactured from porous substrates using micro fabrication techniques. Porous emitter(s) can be microfabricated by removing material from a substrate made from a porous dielectric material (e.g., porous ceramic, glass or other oxide material) via chemical wet etching, plasma dry etching, ion beam milling, laser milling, etc. A method for manufacturing the emitters can include the following steps: (1) providing a porous material 1650 (step 1600) and (2) selectively removing material from porous material 1650 (step 1710). In some embodiments, hydrolic acid can be used to open up the pores of the material after, e.g., the milling process.

Figure 17:
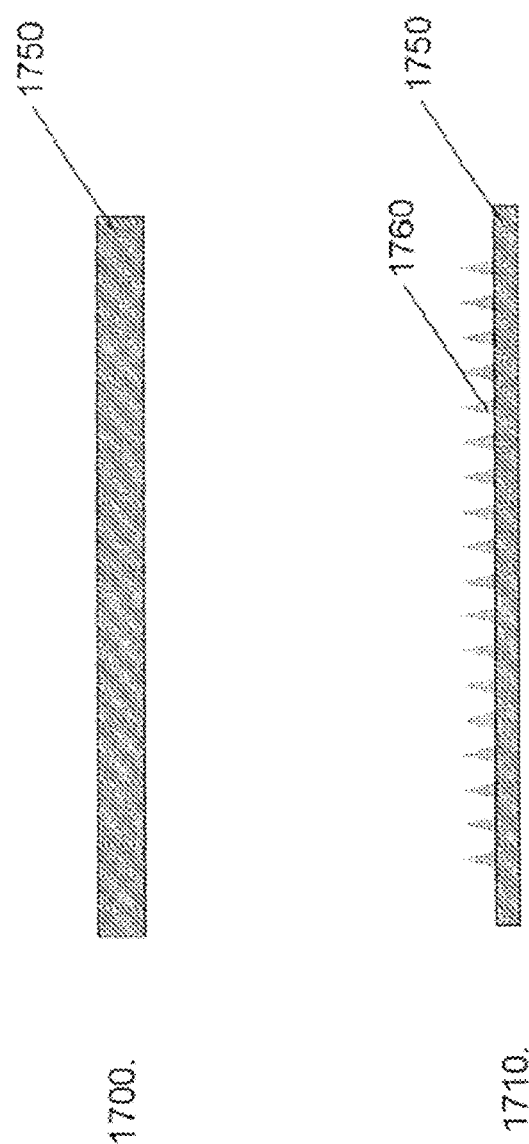
FIG. 17 shows a schematic for a method for manufacturing an electrospray emitter, according to an illustrative embodiment of the invention.

FIG. 17 shows a schematic for a method for manufacturing an electrospray emitter, according to an illustrative embodiment of the invention. Single emitters or arrays of emitters (e.g., 1D or 2D arrays) can be manufactured from porous substrates using micro fabrication techniques. Porous emitter(s) can be microfabricated by depositing a porous dielectric material (e.g., porous ceramic, glass or other oxide material) onto a porous substrate via chemical vapor deposition, physical vapor deposition, deposition of nano-beads, etc. A method for manufacturing the emitters can include the following steps: (1) providing a porous material 1750 (step 1700) and (2) selectively depositing porous dielectric materials 1760 onto the porous material 1750 (step 1710). In some embodiments, a mold can be used to form the emitters (e.g., into a needle array).

In some embodiments, emitters can be manufactured using methods that allow for the monolithic building of emitters at the same time as the fabrication of the porous substrate from which the emitter is made. For example, emitters or emitter arrays can be formed by molding a porous substrate during its fabrication. Beneficially, for example, such approaches can facilitate alignment of the emitters and extractor grid earlier in the manufacturing process to mitigate error that can compound through the manufacturing process.

Figure 18:
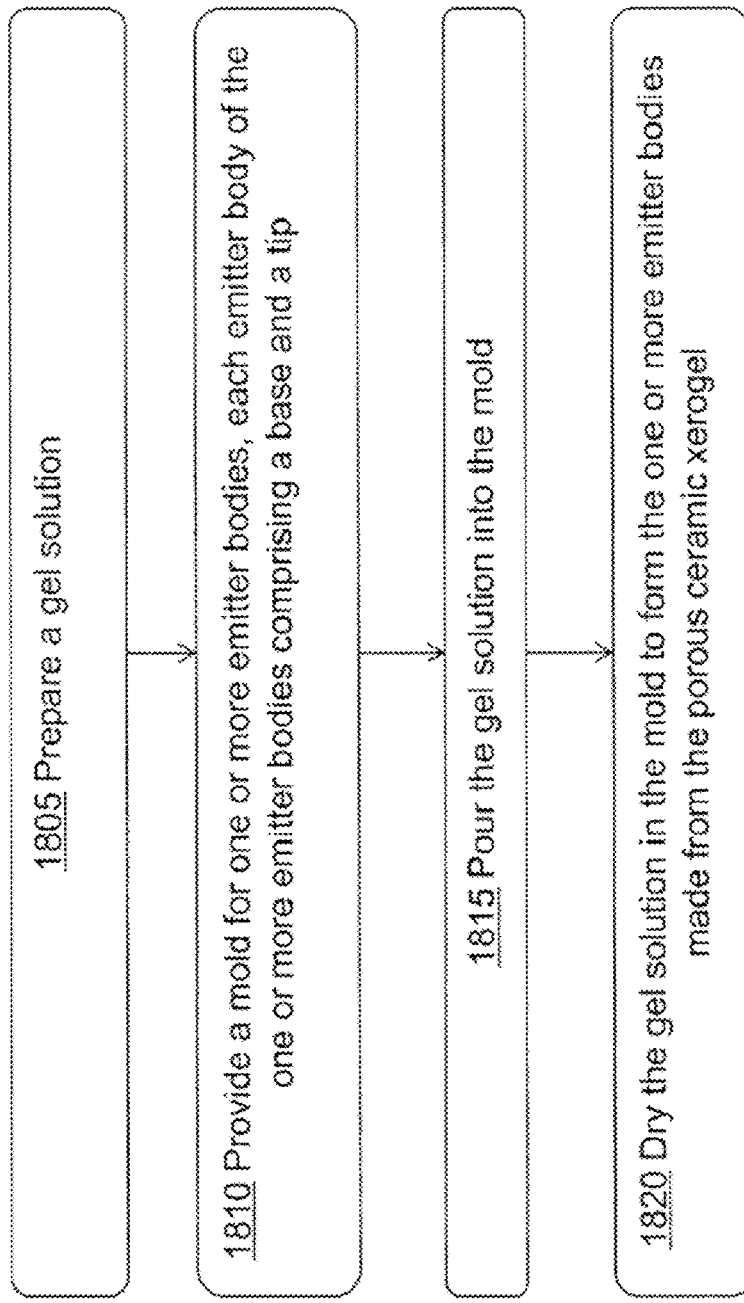
FIG. 18 is a flowchart illustrating a method for manufacturing electrospray emitters.

FIG. 18 is a flowchart illustrating a method for manufacturing electrospray emitters. In some embodiments, emitters (e.g., the emitters described herein) can be manufactured using a sol-gel process. For example, emitter bodies can be made of a porous ceramic xerogel fabricated by a sol-gel process. As illustrated, at step 1805 a gel solution is prepared. In some embodiments, a gel solution comprising a solvent, an acidic aluminum salt, a polymer, and/or a proton scavenger can be prepared. For example, to form an alumina xerogel, the gel solution can comprise aluminum chloride hexahydrate, polyethylene oxide, water, ethanol, and propylene oxide. In some embodiments, the gel solution can comprise 1 part by mass of polyethylene oxide, 50 parts by mass water, 54.4 parts by mass ethanol, 54.4 parts by mass propylene oxide, and 54 parts by mass of aluminum chloride hexahydrate.

At step 1810, a mold for one or more emitter bodies is provided. The mold can be for forming emitter bodies that include a base and a tip. The mold can be made from polydimethylsiloxane (PDMS), polytetrafluoroethylene (PTFE), polymers, fluoropolymers, paraffin wax, silica, glass, aluminum, and/or stainless steel. In some embodiments, the mold can be polished with a smooth finish. In some embodiments, micro fabrication techniques can be used to create molds with micron sized features (e.g., for forming emitters). Silicon micro fabrication can be used to form the positive for the mold. In some embodiments laser ablation can be used to form small features (e.g., for forming emitters) in molds. At step 1815, the gel solution can be poured into the mold. At step 1820, the gel solution can be dried in the mold to form the emitter bodies from the porous ceramic xerogel. In some embodiments, the porous ceramic xerogel made by the described process can include pores approximately 3-5 μm in diameter.

Figure 19:
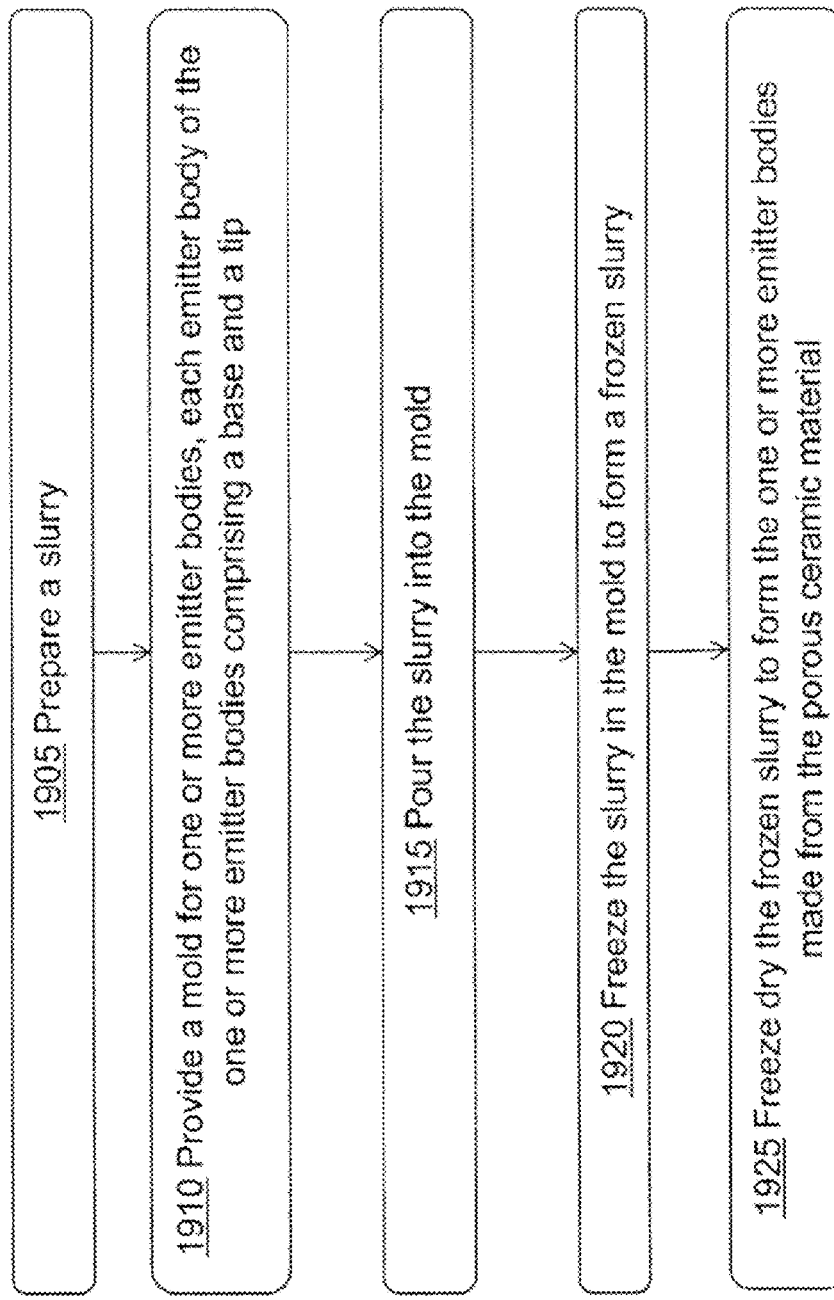
FIG. 19 is a flowchart illustrating a method for manufacturing electrospray emitters.

FIG. 19 is a flowchart illustrating a method for manufacturing electrospray emitters. In some embodiments, emitters (e.g., the emitters described herein) can be manufactured using a freeze cast process. For example, emitter bodies can be made of a porous ceramic material fabricated by a freeze cast process. As illustrated, at step 1905 a slurry is prepared. For example, a slurry can be prepared comprising a ceramic component. The slurry can comprise at least silica, water, and a ceramic component. In some embodiments, the slurry can comprise a mixture of colloidal silica (e.g., LUDOX™-50 sold by Sigma-Aldrich Co.) and nanopowder alumina (e.g., calcined alumina A16 SG sold by Almatis). In some embodiments, the ratio of alumina to silica can be varied from 45-65% alumina and 55-35% silica by mass to vary the pore size. Deionized water, ethanol, isopropanol, glycerol, and/or other solvents can be added to alter the porosity of the resulting porous ceramic material. For example, the addition of glycerol can contribute to pore size uniformity. The slurry can be mixed to form a homogenous, white, and viscous liquid.

At step 1910, a mold for one or more emitter bodies is provided. The mold can be for forming emitter bodies that include a base and a tip. The mold can be made from polydimethylsiloxane (PDMS), polytetrafluoroethylene (PTFE), polymers, fluoropolymers, paraffin wax, silica, glass, aluminum, and/or stainless steel. In some embodiments, the mold can be polished with a smooth finish. In some embodiments micro fabrication techniques can be used to create molds with micron sized features (e.g., for forming emitters). Silicon micro fabrication can be used to form the positive for the mold. In some embodiments, laser ablation can be used to form small features (e.g., for forming emitters) in molds.

At step 1915, the slurry can be poured into the mold. At step 1920, the slurry can be frozen in the mold to form a frozen slurry (e.g., being placed into a bath of liquid nitrogen). At step 1925, the frozen slurry can be freeze dried to form the emitter bodies made from the porous ceramic material. For example, the frozen slurry can be placed in a vacuum desiccator, where the ice particles in the frozen slurry are allowed to sublimate resulting in a porous ceramic material. In some embodiments, low temperature sintering can be used to increase the strength of the porous ceramic material. In some embodiments, the porous ceramic material made by the described process can include pores approximately 3-5 μm in diameter. Beneficially, the described freeze casting process can be used for filling micron-sized capillaries with porous ceramic material. For example, the slurry can be allowed to soak up into the capillaries. The slurry, along with the substrate containing the capillaries can be flash frozen and freeze dried as described above.

Figure 20:
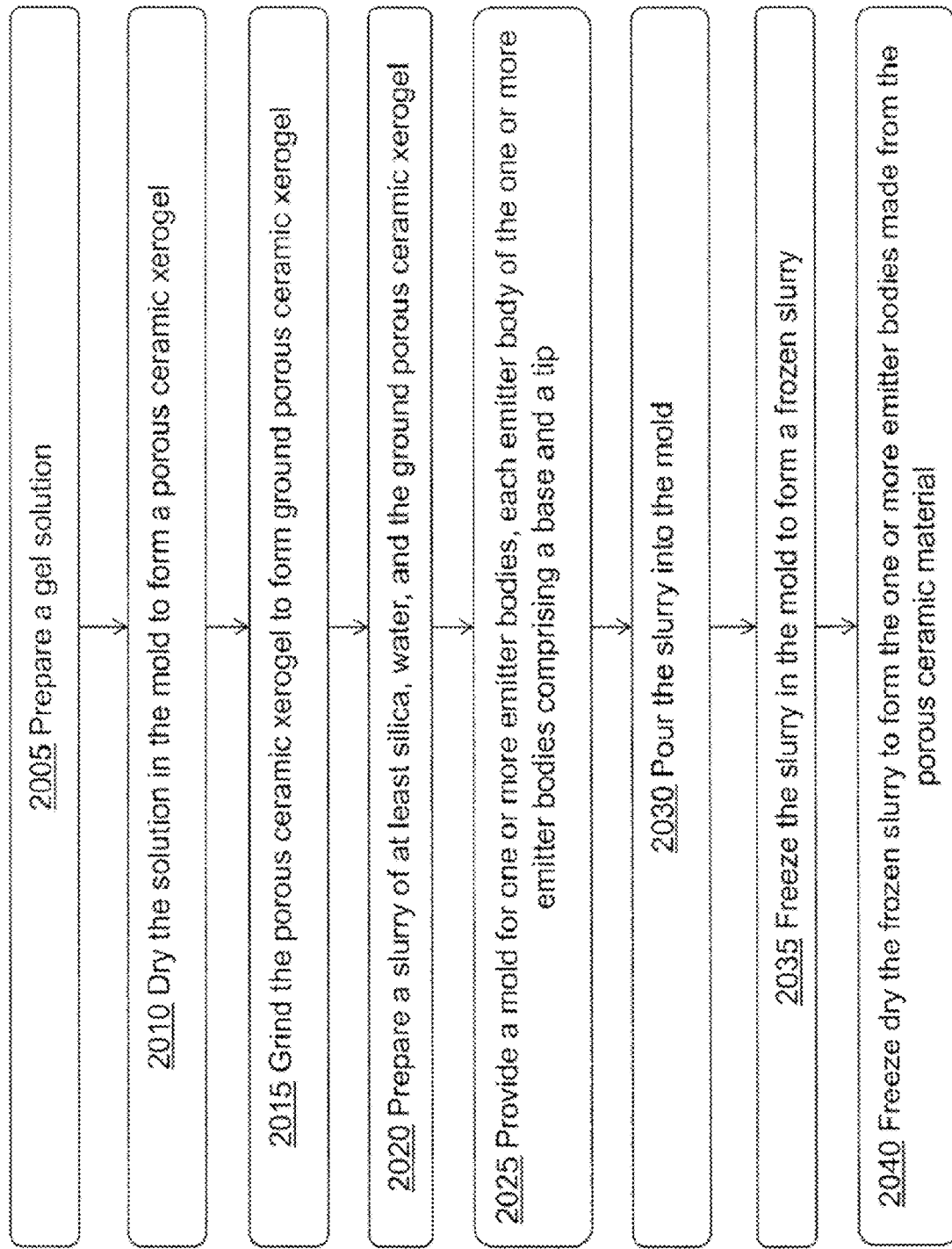
FIG. 20 is a flowchart illustrating a method for manufacturing electrospray emitters.

FIG. 20 is a flowchart illustrating a method for manufacturing electrospray emitters. In some embodiments, emitters (e.g., the emitters described herein) can be manufactured using a combination of sol-gel and freeze cast processes. For example, xerogel particles can be used in a freeze cast process to form emitters. At step 2005, a gel solution is prepared. For example, a gel solution comprising a solvent, an acidic aluminum salt, a polymer, and a proton scavenger can be prepared. At step 2010, the gel solution can be dried to form porous ceramic xerogel. At step 2015, the porous ceramic xerogel can be ground to form ground porous ceramic xerogel (e.g., porous ceramic xerogel particles less than approximately 50 μm in diameter). The ground porous ceramic xerogel can then be used in a freeze cast process. At step 2020, a slurry can be prepared comprising the ground porous ceramic xerogel. The slurry can include at least silica, water, and the ground porous ceramic xerogel.

At step 2025, a mold can be provided, the mold for forming emitter bodies that include a base and a tip. The mold can be made from polydimethylsiloxane (PDMS), polytetrafluoroethylene (PTFE), polymers, fluoropolymers, paraffin wax, silica, glass, aluminum, and/or stainless steel. In some embodiments, the mold can be polished with a smooth finish. In some embodiments micro fabrication techniques can be used to create molds with micron sized features (e.g., for forming emitters). Silicon micro fabrication can be used to form the positive for the mold. In some embodiments laser ablation can be used to form small features (e.g., for forming emitters) in molds. At step 2030, the slurry can be poured into the mold. At step 2035, the slurry can be frozen in the mold to form a frozen slurry (e.g., being placed into a bath of liquid nitrogen). At step 2040, the frozen slurry can be freeze dried to form the emitter bodies made from the porous ceramic material.

FIG. 21 is a schematic of mold 2105 for emitter bodies. Mold 2105 includes emitter tip portion 2110 for forming a tip of an emitter and emitter base portion 2115 for forming a base of the emitter. As described above, material (e.g., a gel solution and/or a slurry) can be poured into mold 2105 to form emitters (e.g., emitters having a body with a base and a tip). Mold 2105 can be formed as described above.

In some embodiments, a freeze cast process can be used to fabricate emitters having a pore size gradient that decreases from the base of the emitter to the tip emitter (e.g., as described above). For example, when freezing the slurry, a temperature gradient can be introduced to form a gradient in the pore size of the resulting porous material. In some embodiments, the slurry can be placed on a thermally conductive base, which is then cooled. Ice particles nearer to the thermally conductive base will freeze faster and result in smaller ice crystals than ice crystals further away from the thermally conductive base. During freeze drying, the smaller ice crystals can result in smaller pore size in the porous material than the larger ice crystals. In some embodiments, a temperature gradient that increases from the emitter tip portion of the mold to the emitter base portion of the mold (e.g., as illustrated by arrow 2120 of FIG. 21) is applied to the slurry in the mold during freezing so that the resulting porous material has a pore size gradient that decreases from the base of the emitter to the tip emitter. In some embodiments, a freeze cast process can be used to fabricate emitters having a pore size gradient that decreases from the base of the emitter to the tip emitter by layering slurries of different compositions. For example, thin layers of slurry in the mold can be flash frozen (e.g., by using liquid nitrogen). Additional layers of slurry (e.g., slurry with a different composition recipe that is conducive to larger (or smaller) pore sizes) can be freeze casted on the previous slurry layer. This process can be repeated until the desired porosity gradient is achieved.

Experimental Results

At the electrode-liquid interface of some ion sources, an electrochemical double layer (DL) exists in a state of equilibrium. As current is supplied to or drawn from the electrode, its charge level is modified, thus changing the potential difference across the DL. When the DL potential exceeds the electrochemical window limit of the ionic liquid, electronic charge can transfer across the interface (Faradic current) with potentially damaging redox reactions. As described above, some embodiments of the invention can include a distal electrode (e.g., distal electrodes 1322, 1424, and 1520) making electrical contact exclusively with the ionic liquid. Such a configuration can mitigate electrochemical degradation of emitter tips. By moving the electrical contact from, for example, the emitters to a distal electrode with a relatively large surface area, electrochemical reactions at the emitter tips can be reduced, both in single emitters and dense arrays. The DL forming at the distal electrode can still saturate, but only after a comparatively long time. For example, for emitters spaced out in a two-dimensional array by a distance p, saturation time will be on the order of $\tau^* \sim \tau \, (p/D)^4$ as the current distributes in the larger area $\sim p^2$. Similarly, the distal electrode can be as large as practical in single emitters. In both cases, voltage alternation at modest frequencies can be a technique for preventing electrochemical degradation.

As described above, in some embodiments, emitters can be fabricated from an insulating material (e.g., porous ceramic, glass or other oxide material). In these embodiments, there is no electrochemistry at the emitter surface as long as the electrochemical window is always lower than the equilibrium DL potential, which would not change as the local surface potential would follow the potential of the liquid. In some embodiments, emitters can be fabricated from metal, but separated from the distal electrode by the ionic liquid itself. In these embodiments, the electric potential of the metallic emitter substrate would be constant, while the potential difference across the DL would change as a result of the ohmic drop along the effective liquid path l separating the distal electrode from the emission site near the micro-tips, given by $\Delta V \approx lI/KA$. A is the effective cross sectional area through which the current I is transported. As long as $\Delta V \ll V_w$, electrochemical reactions will not occur at significant rates along the liquid path in contact with the metallic emitter substrate.

An emitter was wetted with EMI-BF4 and passed through a stainless steel cylindrical reservoir serving as distal electrode (e.g., as illustrated in FIGS. 13A and 13B), such that its contact area with the liquid is 18 mm$^2$. A square-wave voltage (±1285 V) was applied to the extractor electrode at a frequency of 0.1 Hz. The emitter voltage with respect to ground was monitored using a high impedance (>1 T$\Omega$) electrometer. The exposed emitter length, L, was varied from about 1 to 4 mm, in-situ. The effective liquid path was then l~L. The current to the cylinder (equal to the ion beam current) was monitored by a second electrometer and varied from 60-70 nA for short and long L, respectively. Experiments were carried out in vacuum at pressures about 10$^{-6}$ Torr.

FIG. 22 is a graph 2200 showing the relative variation of the emitter voltage immediately after polarity reversal. The relative variation of the emitter voltage immediately after polarity reversal (at t=0) is plotted for two exposed lengths. Eventually, the charging rates of the emitter in both cases become very similar and are consistent with uniform capacitive charging of the cylinder inner surface (~0.04 V/s). The voltage offset between the two curves is due to a quick difference of initial slopes. Its value (~0.01 V) is also consistent with the anticipated ohmic drop (higher, for longer L) along the liquid layer on the exposed surface.

While the invention has been particularly shown and described with reference to specific illustrative embodiments, it should be understood that various changes in form and detail may be made without departing from the spirit and scope of the invention.

What is claimed is:

1. A method of forming an electrospray emitter comprising:
   pouring a gel solution into a mold shaped to form one or more emitter bodies with a base and a tip; and
   drying the gel solution in the mold to form the one or more emitter bodies at least partially from a porous material.

2. The method of claim 1, wherein the gel solution is a sol gel solution.

3. The method of claim 2, wherein the sol gel solution includes a solvent, an acidic aluminum salt, a polymer, and a proton scavenger.

4. The method of claim 2, further comprising mixing aluminum chloride hexahydrate, polyethylene oxide, water, ethanol, and propylene oxide to form the sol gel solution.

5. The method of claim 1, wherein the porous material is a ceramic.

6. The method of claim 1, wherein the porous material is alumina.

7. The method of claim 1, further comprising treating and/or processing the tip of each emitter body such that a pore size of the one or more emitter bodies decreases from the base to the tip of the one or more emitter bodies.

8. The method of claim 1, wherein the gel solution has a composition such that resulting pores of the porous material have a diameter between or equal to 3 µm and 5 µm.

9. The method of claim 1, wherein the mold is shaped to form a tip of the one or more emitter bodies with a radius of curvature between or equal to 1 µm and 20 µm.

10. The method of claim 1, further comprising electrochemically etching the one or more emitter bodies to form tips having a radius of curvature of between or equal to 1 µm and 20 µm.

11. A method of forming an electrospray emitter comprising:

pouring a slurry including ground porous material into a mold shaped to form one or more emitter bodies with a base and a tip;

freezing the slurry in the mold to form a frozen slurry; and drying the frozen slurry to form the one or more porous emitter bodies.

12. The method of claim 11, wherein drying the frozen slurry includes freeze-drying the frozen slurry.

13. The method of claim 11, wherein the ground porous material is a ground porous ceramic.

14. The method of claim 11, further comprising sintering the one or more emitter bodies.

15. The method of claim 11, wherein freezing the slurry further comprises freezing the slurry in the mold with a temperature gradient such that a temperature of the slurry increases in a direction from the tip of the one or more emitter bodies toward the base of the one or more emitter bodies.

16. The method of claim 15, wherein freezing the slurry with the temperature gradient results in a pore size of the one or more emitter bodies decreasing from the base to the tip of the one or more emitter bodies.

17. The method of claim 11, further comprising treating and/or processing the tip of each emitter body such that a pore size of the one or more emitter bodies decreases from the base to the tip of the one or more emitter bodies.

18. The system of claim 11, wherein the slurry has a composition such that resulting pores of the one or more porous emitter bodies have a diameter between or equal to 3 μm and 5 μm.

19. The system of claim 11, wherein the mold is shaped to form a tip of the one or more emitter bodies with a radius of curvature between or equal to 1 μm and 20 μm.

20. The method of claim 11, further comprising grinding a porous material to form the ground porous material.

* * * * *